US012660466B2

(12) United States Patent
Lim et al.

(10) Patent No.: US 12,660,466 B2
(45) Date of Patent: Jun. 16, 2026

(54) DISPLAY APPARATUS

(71) Applicant: Samsung Display Co., Ltd., Yongin-si (KR)

(72) Inventors: Sanghyung Lim, Yongin-si (KR); Soonmi Choi, Yongin-si (KR); Ran Kim, Yongin-si (KR); Younggil Park, Yongin-si (KR); Dongyeon Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 406 days.

(21) Appl. No.: 18/318,066

(22) Filed: May 16, 2023

(65) Prior Publication Data

US 2023/0380239 A1 Nov. 23, 2023

(30) Foreign Application Priority Data

May 17, 2022 (KR) ......................... 10-2022-0060455

(51) Int. Cl.
*H10K 59/38* (2023.01)
*H10K 59/131* (2023.01)
*H10K 59/80* (2023.01)

(52) U.S. Cl.
CPC ........... *H10K 59/38* (2023.02); *H10K 59/131* (2023.02); *H10K 59/879* (2023.02)

(58) Field of Classification Search
CPC .... H10K 59/38; H10K 59/131; H10K 59/879; H10K 2102/331; H10K 59/873;
(Continued)

(56) References Cited

U.S. PATENT DOCUMENTS 6,630,274 B1 10/2003 Kiguchi et al.
10,916,722 B2 2/2021 Park et al.
(Continued)

FOREIGN PATENT DOCUMENTS

KR 10-2018-0090260 8/2018
KR 10-1914527 11/2018
(Continued)

*Primary Examiner* — Chad M Dicke
*Assistant Examiner* — Gary Abel
(74) *Attorney, Agent, or Firm* — CANTOR COLBURN LLP

(57) ABSTRACT

A display apparatus includes first to third light-emitting elements disposed on a substrate, a first-color light output layer, a second-color quantum dot layer, and a third-color quantum dot layer, which are disposed on the first to third light-emitting elements, respectively, a first capping layer disposed on the first-color light output layer, the second-color quantum dot layer, and the third-color quantum dot layer to correspond to the first to third light-emitting elements, a low-refractive-index layer disposed on the first capping layer, a first barrier layer between the first capping layer and the low-refractive-index layer, a first-color color filter layer disposed on the low-refractive-index layer to correspond to the first light-emitting element, a second-color color filter layer disposed on the low-refractive-index layer to correspond to the second light-emitting element, and a third-color color filter layer disposed on the low-refractive-index layer to correspond to the third light-emitting element.

18 Claims, 25 Drawing Sheets

(58) Field of Classification Search
CPC .. H10K 59/12; H10K 59/1201; H10K 50/115; H10K 50/844; H10K 50/858; H10K 59/35; H10K 59/00; H10K 59/70; H10K 59/1315; H10K 50/8445; H10K 50/854; H10K 59/8731; H10K 59/877; H10K 59/127; H10K 71/50; H10K 59/80–88
See application file for complete search history.

(56) References Cited

U.S. PATENT DOCUMENTS

| | | | |
|---|---|---|---|
| 11,175,530 B2 | 11/2021 | Park et al. | |
| 11,456,338 B2 | 9/2022 | Lee et al. | |
| 11,513,385 B2 | 11/2022 | Park et al. | |
| 11,705,544 B2 | 7/2023 | Kim et al. | |
| 2020/0091464 A1* | 3/2020 | Park | H10K 59/30 |
| 2020/0136074 A1* | 4/2020 | Lee | H10K 59/38 |
| 2020/0227485 A1* | 7/2020 | Park | H10K 59/879 |
| 2021/0311338 A1 | 10/2021 | Lee et al. | |
| 2021/0359011 A1 | 11/2021 | Lee | |
| 2022/0052118 A1 | 2/2022 | Kim et al. | |
| 2024/0038943 A1 | 2/2024 | Kim et al. | |

FOREIGN PATENT DOCUMENTS

| | | |
|---|---|---|
| KR | 10-2019-0044712 | 5/2019 |
| KR | 10-2020-0030147 | 3/2020 |
| KR | 1020200032294 A | 3/2020 |
| KR | 10-2020-0135130 | 12/2020 |
| KR | 10-2021-0142038 | 11/2021 |
| KR | 10-2021-0147612 | 12/2021 |
| KR | 1020220019198 A | 2/2022 |
| KR | 1020220051900 A | 4/2022 |

* cited by examiner

DISPLAY APPARATUS

CROSS-REFERENCE TO RELATED APPLICATION(S)

This application claims priority to and benefits of Korean Patent Application No. 10-2022-0060455 under 35 U.S.C. § 119, filed on May 17, 2022 in the Korean Intellectual Property Office, the entire contents of which are incorporated herein by reference.

BACKGROUND

1. Technical Field

One or more embodiments relate to display apparatuses.

2. Description of the Related Art

Display apparatuses include many pixels. For full color display apparatuses, pixels may emit light of different colors. To this end, at least some pixels of display apparatuses may include a color converter. Accordingly, light of a first color generated in emission units of some pixels may be converted into light of a second color while passing through a corresponding color converter, and may be passed to the outside.

SUMMARY

One or more embodiments include display apparatuses in which the degradation of a quantum dot layer and the deformation of a low-refractive-index layer may be prevented.

Additional aspects will be set forth in part in the description which follows and, in part, will be apparent from the description, or may be learned by practice of the embodiments of the disclosure.

According to one or more embodiments, a display apparatus may include a first light-emitting element, a second light-emitting element, and a third light-emitting element, which may be disposed on a substrate, a first-color light output layer, a second-color quantum dot layer, and a third-color quantum dot layer, which may be disposed on the first light-emitting element, the second light-emitting element, and the third light-emitting element, respectively, a first capping layer disposed on the first-color light output layer, the second-color quantum dot layer, and the third-color quantum dot layer to correspond to the first light-emitting element, the second light-emitting element, and the third light-emitting element, a low-refractive-index layer disposed on the first capping layer, a first barrier layer between the first capping layer and the low-refractive-index layer, a first-color color filter layer disposed on the low-refractive-index layer to correspond to the first light-emitting element, a second-color color filter layer disposed on the low-refractive-index layer to correspond to the second light-emitting element, and a third-color color filter layer disposed on the low-refractive-index layer to correspond to the third light-emitting element.

According to an embodiment, the display apparatus may further include a second barrier layer between the first capping layer, and the first-color light output layer, the second-color quantum dot layer, and the third-color quantum dot layer.

According to an embodiment, the first barrier layer and the second barrier layer may include materials different from each other.

According to an embodiment, the second barrier layer may include a first barrier pattern corresponding to the first light-emitting element, a second barrier pattern corresponding to the second light-emitting element, and a third barrier pattern corresponding to the third light-emitting element, and the first barrier pattern, the second barrier pattern, and the third barrier pattern may be apart from one another.

According to an embodiment, each of the first light-emitting element, the second light-emitting element, and the third light-emitting element may be provided in plural, each of the first barrier pattern, the second barrier pattern, and the third barrier pattern may be provided in plural, and the display apparatus may further include a first conductive line electrically connected to the plurality of first barrier patterns that correspond to the plurality of first light-emitting elements, a second conductive line electrically connected to the plurality of second barrier patterns that correspond to the plurality of second light-emitting elements, and a third conductive line electrically connected to the plurality of third barrier patterns that correspond to the plurality of third light-emitting elements.

According to an embodiment, each of the first light-emitting element, the second light-emitting element, and the third light-emitting element may be provided in plural, each of the plurality of first light-emitting elements, the plurality of second light-emitting elements, and the plurality of third light-emitting elements may be arranged in a direction, the second barrier layer may include a first barrier pattern that corresponds to the plurality of first light-emitting elements, a second barrier pattern that corresponds to the plurality of second light-emitting elements, and a third barrier pattern that corresponds to the plurality of third light-emitting elements, and the first barrier pattern, the second barrier pattern, and the third barrier pattern may be apart from one another.

According to an embodiment, the display apparatus may further include a conductive line electrically connected to the second barrier layer and extending in a direction.

According to an embodiment, the display apparatus may further include a second capping layer between the first light-emitting element, the second light-emitting element, and the third light-emitting element, and the first-color light output layer, the second-color quantum dot layer, and the third-color quantum dot layer.

According to an embodiment, the display apparatus may further include a third capping layer between the low-refractive-index layer, and at least one of the first-color color filter layer, the second-color color filter layer, and the third-color color filter layer.

According to an embodiment, the first barrier layer may include a transparent organic layer.

According to an embodiment, the low-refractive-index layer may include a matrix portion and particles in the matrix portion.

According to another aspect of the disclosure, a display apparatus may include a first light-emitting element, a second light-emitting element, and a third light-emitting element, which may be disposed on a substrate, a first-color light output layer, a second-color quantum dot layer, and a third-color quantum dot layer, which may be disposed on the first light-emitting element, the second light-emitting element, and the third light-emitting element, respectively, a first capping layer disposed on the first-color light output layer, the second-color quantum dot layer, and the third-color quantum dot layer to correspond to the first light-emitting element, the second light-emitting element, and the third light-emitting element, a low-refractive-index layer disposed on the first capping layer, a barrier layer between the first capping layer, and the first-color light output layer, the second-color quantum dot layer, and the third-color quantum dot layer, a first-color color filter layer disposed on the low-refractive-index layer to correspond to the first light-emitting element, a second-color color filter layer disposed on the low-refractive-index layer to correspond to the second light-emitting element, and a third-color color filter layer disposed on the low-refractive-index layer to correspond to the third light-emitting element.

According to an embodiment, the barrier layer may include a transparent conductive material.

According to an embodiment, the barrier layer may include a first barrier pattern corresponding to the first light-emitting element, a second barrier pattern corresponding to the second light-emitting element, and a third barrier pattern corresponding to the third light-emitting element, and the first barrier pattern, the second barrier pattern, and the third barrier pattern may be apart from one another.

According to an embodiment, each of the first light-emitting element, the second light-emitting element, and the third light-emitting element may be provided in plural, each of the first barrier pattern, the second barrier pattern, and the third barrier pattern may be provided in plural, and the display apparatus may further include a first conductive line electrically connected to the plurality of first barrier patterns that correspond to the plurality of first light-emitting elements, a second conductive line electrically connected to the plurality of second barrier patterns that correspond to the plurality of second light-emitting elements, and a third conductive line electrically connected to the plurality of third barrier patterns that correspond to the plurality of third light-emitting elements.

According to an embodiment, each of the first light-emitting element, the second light-emitting element, and the third light-emitting element may be provided in plural, each of the plurality of first light-emitting elements, the plurality of second light-emitting elements, and the plurality of third light-emitting elements may be arranged in a direction, the barrier layer may include a first barrier pattern that corresponds to the plurality of first light-emitting elements, a second barrier pattern that corresponds to the plurality of second light-emitting elements, and a third barrier pattern that corresponds to the plurality of third light-emitting elements, and the first barrier pattern, the second barrier pattern, and the third barrier pattern may be apart from one another.

According to an embodiment, the display apparatus may further include a conductive line electrically connected to the barrier layer and extending in a direction.

According to an embodiment, the display apparatus may further include a second capping layer between the first light-emitting element, the second light-emitting element, and the third light-emitting element, and the first-color light output layer, the second-color quantum dot layer, and the third-color quantum dot layer.

According to an embodiment, the display apparatus may further include a third capping layer between the low-refractive-index layer, and at least one of the first-color color filter layer, the second-color color filter layer, and the third-color color filter layer.

According to an embodiment, the low-refractive-index layer may include a matrix portion and particles in the matrix portion.

Other aspects, features, and advantages than those described above will become apparent from the following drawings, claims, and detailed descriptions to embody the disclosure below.

These general and specific embodiments may be implemented by using a system, a method, a computer program, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 20 to 22 are schematic cross-sectional views showing, step by step, a method of manufacturing a display apparatus, according to an embodiment;

DETAILED DESCRIPTION OF THE EMBODIMENTS

Figure 1:
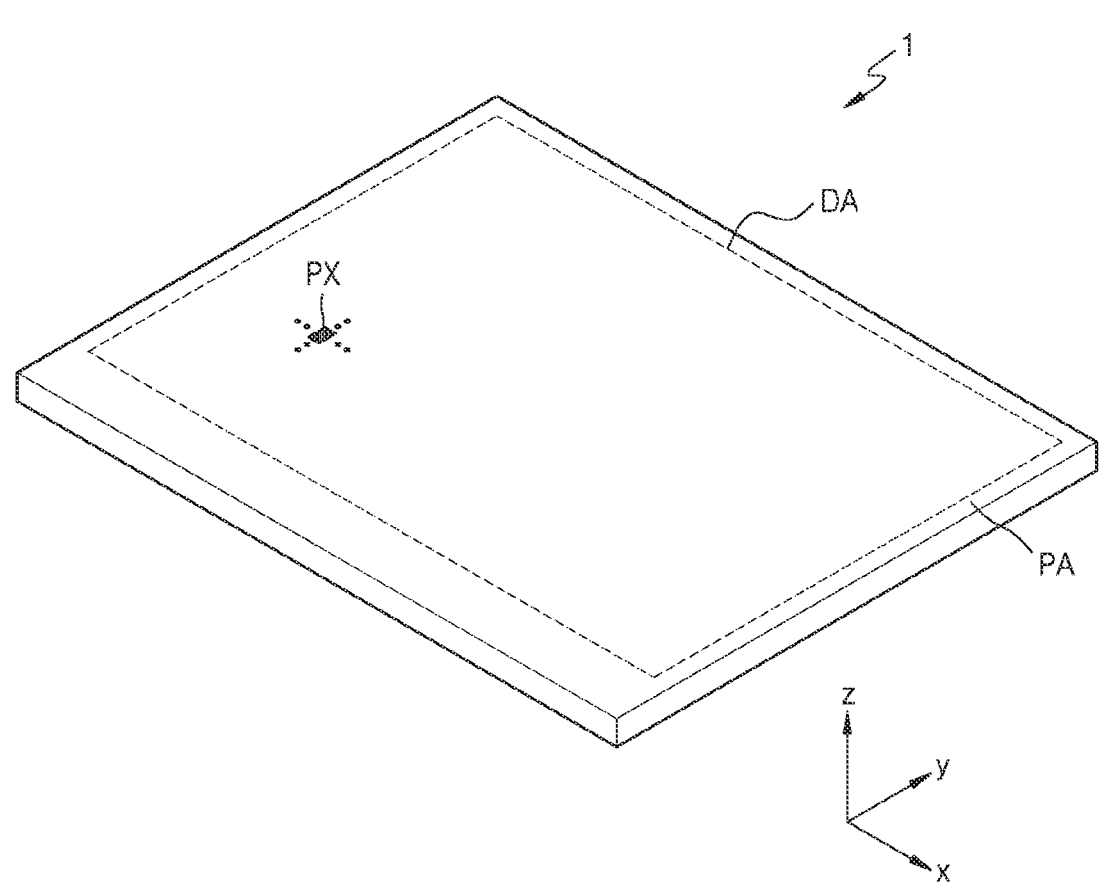
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the singular forms, "a," "an," and "the" are intended to include the plural forms as well, unless the context clearly indicates otherwise.

As used herein, the term "and/or" includes any and all combinations of one or more of the associated listed items. For example, "A and/or B" may be understood to mean any combination including "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

In the embodiments below, it will be understood that although the terms "first," "second," etc. may be used herein to describe various components, these components should not be limited by these terms.

In the embodiments below, when a part may "comprise," "include," or "have" a certain constituent element, unless specified otherwise, it may not be construed to exclude another constituent element but may be construed to further include other constituent elements.

In the embodiments below, it will be understood that when a layer, region, or component is referred to as being "formed on" another layer, region, or component, it can be directly or indirectly formed on the other layer, region, or component. For example, intervening layers, regions, or components may be present.

Sizes of components in the drawings may be exaggerated or reduced for convenience of explanation. For example, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments below, it will be understood that when a layer, region, or component is referred to as being "connected to" another layer, region, or component, it can be directly connected to the other layer, region, or component or indirectly connected to the other layer, region, or component via intervening layers, regions, or components.

In the following examples, the x-axis, the y-axis and the z-axis may not be limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display apparatus 1 according to an embodiment.

Referring to FIG. 1, the display apparatus 1 may include a display area DA that displays an image and a peripheral area PA that may not implement an image. The display apparatus 1 may provide an image to the outside by using light emitted from the display area DA.

Although FIG. 1 illustrates the display apparatus 1 in which the display area DA is a rectangle, the disclosure is not limited thereto. The shape of the display area DA may be circular, oval, or polygonal, such as triangular, pentagonal, and the like. Furthermore, although the display apparatus 1 of FIG. 1 illustrates a flat display apparatus, the display apparatus 1 may be implemented in various shapes, such as a flexible display apparatus, a foldable display apparatus, a rollable display apparatus, and the like.

An organic light-emitting display apparatus is described as an example of the display apparatus 1 according to an embodiment, however; the display apparatus 1 is not limited thereto. In another embodiment, the display apparatus 1 according to one or more embodiments may be a display apparatus, such as an inorganic light-emitting display apparatus or inorganic EL display apparatus, or a quantum-dot light-emitting display apparatus. For example, an emission layer of a light-emitting element in the display apparatus 1 may include an organic material, an inorganic material, quantum dots, an organic material and quantum dots, an inorganic material and quantum dots, or an organic material, an inorganic material, and quantum dots.

Pixels PX may be disposed in the display area DA. Hereinafter, in the specification, each pixel PX may mean a sub-pixel emitting light of a different color, and each pixel PX may be one of, for example, a red sub-pixel, a green sub-pixel, and a blue sub-pixel.

Figure 2:
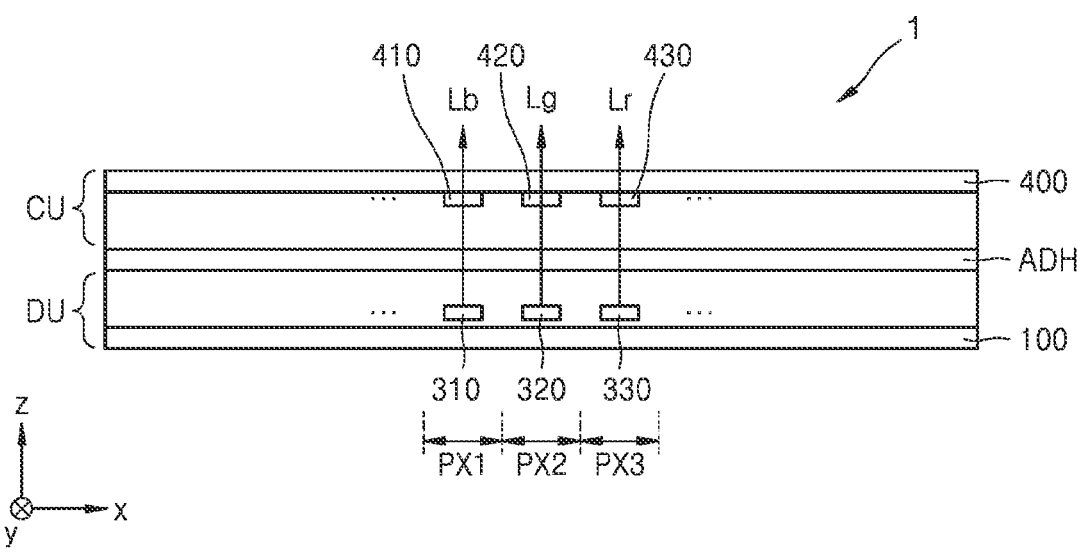
FIG. 2 is a schematic cross-sectional view showing a portion of a display apparatus according to an embodiment.

FIG. 2 is a schematic cross-sectional view showing a portion of the display apparatus 1 according to an embodiment.

Referring to FIG. 2, the display apparatus 1 may include a display unit DU and a color filter unit CU disposed to face the display unit DU. The display unit DU may include a first pixel PX1, a second pixel PX2, and a third pixel PX3, which may be disposed on a first substrate 100. The first pixel PX1, the second pixel PX2, and the third pixel PX3 may be pixels each emitting light of a different color on the first substrate 100. For example, the first pixel PX1 may emit blue light Lb, the second pixel PX2 may emit green light Lg, and the third pixel PX3 may emit red light Lr.

The first pixel PX1, the second pixel PX2, and the third pixel PX3 may include a first light-emitting element 310, a second light-emitting element 320, and a third light-emitting element 330, respectively, each including an organic light-emitting diode (OLED). In an embodiment, the first light-emitting element 310, the second light-emitting element 320, and the third light-emitting element 330 may emit blue light. In another embodiment, the first light-emitting element 310, the second light-emitting element 320, and the third light-emitting element 330 may emit the blue light Lb, the green light Lg, and the red light Lr, respectively.

The color filter unit CU may include a first filter portion 410, a second filter portion 420, and a third filter portion 430. The light from the first light-emitting element 310, the second light-emitting element 320 and the third light-emitting element 330 may be emitted as the blue light Lb, the green light Lg, and the red light Lr, respectively, by passing through the first filter portion 410, the second filter portion 420, and the third filter portion 430.

The first filter portion 410, the second filter portion 420, and the third filter portion 430 may be disposed directly on a second substrate 400. The first filter portion 410 may include a light output layer (first-color light output layer) 419 and a first-color color filter layer 411 of FIG. 4 to be described below, the second filter portion 420 may include a second-color quantum dot layer 429 and a second-color color filter layer 421 of FIG. 4 to be described below, and the third filter portion 430 may include a third-color quantum dot layer 439 and a third-color color filter layer 431 of FIG. 4 to be described below.

In this state, the expression of "being disposed directly on the second substrate 400" may mean that the color filter unit CU is manufactured by forming the first filter portion 410, the second filter portion 420, and the third filter portion 430 directly on the second substrate 400. The display unit DU and the color filter unit CU may be combined with or bonded to each other such that the first filter portion 410, the second filter portion 420, and the third filter portion 430 face the first pixel PX1, the second pixel PX2, and the third pixel PX3, respectively. The number of substrates included in the display apparatus 1 may be two.

In FIG. 2, the display unit DU and the color filter unit CU may be combined with each other via an adhesive layer ADH. The adhesive layer ADH may be, for example, an optical clear adhesive (OCA), but is not necessarily limited thereto, and may be omitted. In another embodiment, the adhesive layer ADH may be a filler 600 (see FIG. 4), and may perform a buffering operation with respect to external pressure and the like. The filler 600 may include an organic material, such as methyl silicone, phenyl silicone, polyimide, and/or the like.

Although FIG. 2 illustrates that the first filter portion 410, the second filter portion 420, and the third filter portion 430 are disposed on the second substrate 400, in another embodiment, the first filter portion 410, the second filter portion 420, and the third filter portion 430 may be disposed on the display unit DU. For example, the first filter portion 410, the second filter portion 420, and the third filter portion 430 may be disposed on an encapsulation layer 500 of FIG. 6 to be described below. The light output layer 419, the second-color quantum dot layer 429, the third-color quantum dot layer 439, the first-color color filter layer 411, the second-color color filter layer 421, and the third-color color filter layer 431 may be disposed on the encapsulation layer 500. First, the light output layer 419, the second-color quantum dot layer 429, and the third-color quantum dot layer 439 may be disposed on the encapsulation layer 500, and the first-color color filter layer 411, the second-color color filter layer 421, and the third-color color filter layer 431 may be disposed thereon. The second substrate 400 may be omitted, and the number of substrates included in the display apparatus 1 may be one.

Figure 3:
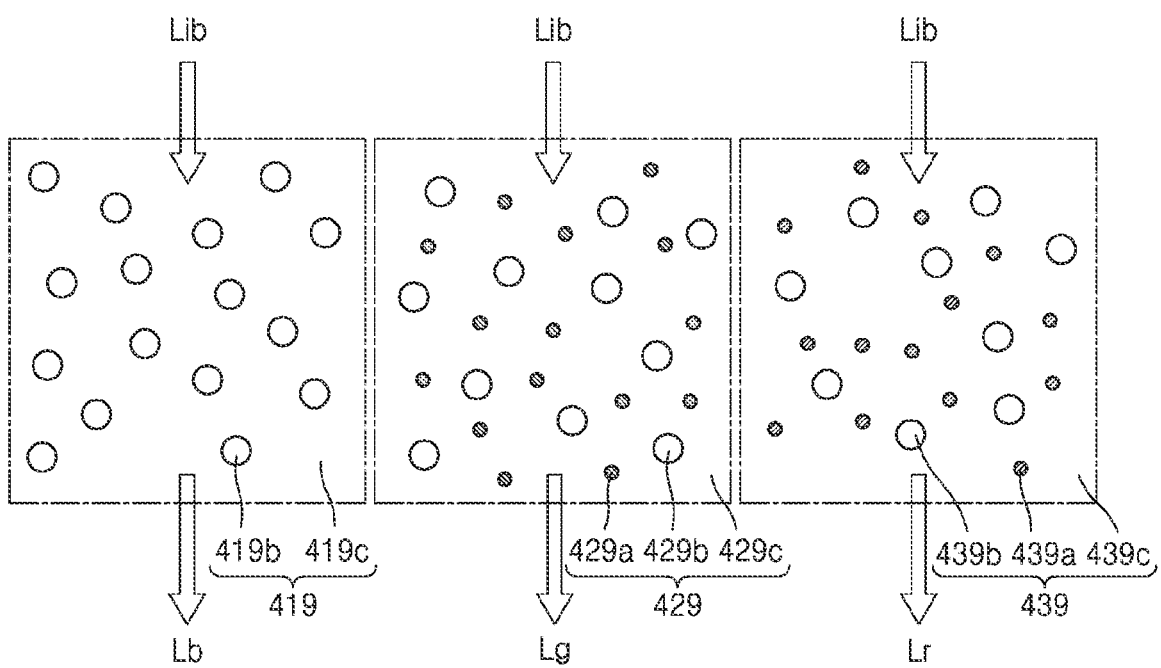
FIG. 3 is an enlarged schematic view of a portion of a display apparatus according to an embodiment.

FIG. 3 is an enlarged schematic view of a portion of the display apparatus 1 according to an embodiment. FIG. 3 illustrates the light output layer 419, the second-color quantum dot layer 429, and the third-color quantum dot layer 439 by enlarging the same.

Referring to FIG. 3, the light output layer 419 may transmit the blue incident light Lib so that the blue light Lb may be emitted in a direction toward the second substrate 400 (see FIG. 2). The light output layer 419 may include a first photosensitive polymer 419$c$ in which first scattering particles 419$b$ are dispersed.

The first photosensitive polymer 419$c$ may include an organic material having light transmissivity, for example, silicon resin, epoxy resin, and/or the like. The first scattering particles 419$b$ may disperse and emit the blue incident light Lib, and may include oxide titanium ($TiO_2$), metal particles, and/or the like.

The second-color quantum dot layer 429 may convert the blue incident light Lib to the green light Lg. The second-color quantum dot layer 429 may include a second photosensitive polymer 429$c$ in which first quantum dots 429$a$ and second scattering particles 429$b$ are dispersed.

The first quantum dots 429$a$, by being excited by the blue incident light Lib, may emit isotropically the green light Lg having a wavelength longer than that of blue light. The second photosensitive polymer 429$c$ may include an organic material having light transmittance, which may include the same material as the first photosensitive polymer 419$c$. The second scattering particles 429$b$ may scatter the blue incident light Lib that may not be absorbed by the first quantum dots 429$a$ to excite more first quantum dots 429$a$, thereby increasing the color conversion rate of the second-color quantum dot layer 429. The second scattering particles 429$b$ may include the same material as the first scattering particles 419$b$.

The third-color quantum dot layer 439 may convert the blue incident light Lib to the red light Lr. The third-color quantum dot layer 439 may include a third photosensitive polymer 439$c$ in which second quantum dots 439$a$ and third scattering particles 439$b$ are dispersed.

The second quantum dots 439$a$, by being excited by the blue incident light Lib, may emit isotropically the red light Lr having a wavelength longer than that of blue light. The third photosensitive polymer 439$c$ may include an organic material having light transmittance, which may include the same material as the first photosensitive polymer 419$c$. The third scattering particles 439$b$ may scatter the blue incident light Lib that may not be absorbed by the second quantum dots 439$a$ to excite more second quantum dots 439$a$, thereby increasing the color conversion rate of the third-color quantum dot layer 439. The third scattering particles 439$b$ may include the same material as the first scattering particles 419$b$.

As described above, the second-color quantum dot layer 429 and the third-color quantum dot layer 439 may include a quantum dot material. The core of a quantum dot may be selected from a Group II-VI compound, a Group III-V compound, a Group IV-VI compound, a Group IV element, a Group IV compound, and a combination thereof.

The Group II-VI compound may be selected from the group consisting of a binary element compound selected from the group consisting of CdSe, CdTe, ZnS, ZnSe, ZnTe, ZnO, HgS, HgSe, HgTe, MgSe, MgS, and a mixture thereof; a ternary element compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from the group consisting of a binary element compound selected from the group consisting of GaN, GaP, GaAs, GaSb, AlN, AlP, AlAs, AlSb, InN, InP, InAs, InSb and a mixture thereof; a ternary element compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group consisting of a binary element compound selected from the group consisting of SnS, SnSe, SnTe, PbS, PbSe, PbTe, and a mixture thereof; a ternary element compound selected from the group consisting of SnSeS, SnSeTe, SnSTe, PbSeS, PbSeTe, PbSTe, SnPbS, SnPbSe, SnPbTe, and a mixture thereof; and a quaternary element compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary element compound selected from the group consisting of SiC, SiGe, and a mixture thereof.

In this state, the binary element compound, the ternary element compound, or the quaternary element compound may exist in a particle at a uniform concentration, or exist in the same particle by being divided into states of partially different concentration distributions. Also, the quantum dot may have a core/shell structure of one quantum dot surrounding another quantum dot. The interface of a core and a shell may have a concentration gradient in which concentration of an element existing in the shell decreases toward the center of the core/shell structure.

In some embodiments, the quantum dot may have a core-shell structure in which a core including the above-described nano crystal and a shell surrounding the core. The shell of a quantum dot may function as a protection layer to maintain semiconductor properties by preventing chemical deformation of the core and/or a charging layer to provide the quantum dot with electrophoretic properties. The shell may be a single layer or a multilayer. The interface of the core and the shell may have a concentration gradient in which the concentration of an element existing in the shell decreases toward the center of the core/shell structure. Examples of the shell of the quantum dot may include a metal or non-metal oxide, a semiconductor compound, a combination thereof, or the like.

For example, the metal or non-metal oxide may include binary element compounds, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like, or ternary element compounds, such as $MgAl_2O_4$, $CoFe_2O_4$, $NiFe_2O_4$, $CoMn_2O_4$, and/or the like, but the disclosure is not limited thereto.

Furthermore, the semiconductor compounds may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but the disclosure is not limited thereto.

The quantum dot may have a full width of half maximum (FWHM) of a light-emitting wavelength spectrum of about 45 nm or less, about 40 nm or less, or about 30 nm or less, in the range of which color purity or color reproducibility may be enhanced. Furthermore, light emitted through the quantum dot described above may be emitted in all directions so that a light viewing angle may be improved.

Furthermore, the shape of a quantum dot is not specifically limited to a shape that may be used in the field, and in detail, a nano particle, a nano tube, a nano wire, a nano fiber, a nano plate particle, or the like of a spherical shape, a pyramid shape, a multi-arm shape, or a cubic shape may be used.

The quantum dot may adjust the color of light emitted depending on the size of a particle. Accordingly, the quantum dot may have various light-emitting colors of blue, red, green, and/or the like.

Although FIG. 3 illustrates that the light output layer 419 includes the first photosensitive polymer 419c in which the first scattering particles 419b are dispersed, in another embodiment, the light output layer 419 may include a photosensitive polymer in which quantum dots and scattering particles are dispersed. In other words, the light output layer 419 may be a transmission layer or a quantum dot layer.

Figure 4:
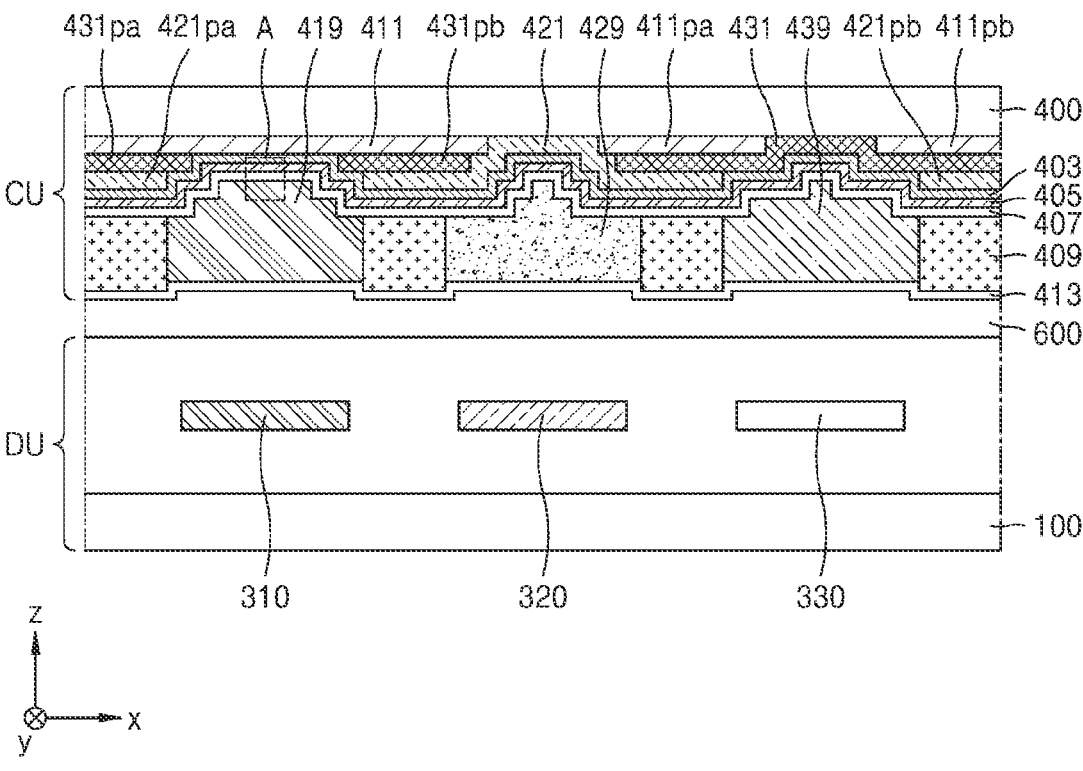
FIG. 4 is a schematic cross-sectional view showing a portion of a display apparatus according to an embodiment.

FIG. 4 is a schematic cross-sectional view showing a portion of the display apparatus 1 according to an embodiment.

Referring to FIG. 4, the display apparatus 1 (see FIG. 1) may include the display unit DU and the color filter unit CU. The filler 600 may be between the display unit DU and the color filter unit CU.

The display unit DU may include the first substrate 100, and the first light-emitting element 310, the second light-emitting element 320, and the third light-emitting element 330 disposed above the first substrate 100. The first light-emitting element 310, the second light-emitting element 320, and the third light-emitting element 330 may include a first-color emission layer described below in FIG. 6.

The color filter unit CU may include the second substrate 400, the first-color color filter layer 411, the second-color color filter layer 421, the third-color color filter layer 431, a low-refractive-index layer 403, a first barrier layer 405, a first capping layer 407, a first insulating layer 409, the light output layer 419, the second-color quantum dot layer 429, the third-color quantum dot layer 439, and a second capping layer 413.

In the following description, for convenience of explanation, the color filter CU is described in a stack order on the second substrate 400, for example, in a −z direction.

The second substrate 400 may include a glass material, a ceramic material, a metal material, and/or a flexible or bendable material. In case that the second substrate 400 is flexible or bendable, the second substrate 400 may include polymer resin, such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The second substrate 400 may have a single layer or multilayer structure of the material, and for a multilayer structure, the second substrate 400 may further include an inorganic layer. In some embodiments, the second substrate 400 may have a structure of an organic material/an inorganic material/an organic material.

The first-color color filter layer 411 may be disposed on the second substrate 400 corresponding to the first light-emitting element 310, the second-color color filter layer 421 may be disposed on the second substrate 400 corresponding to the second light-emitting element 320, and the third-color color filter layer 431 may be disposed on the second substrate 400 corresponding to the third light-emitting element 330. In other words, when viewed from a direction (±z directions) perpendicular to the second substrate 400, the first-color color filter layer 411 may overlap the first light-emitting element 310, the second-color color filter layer 421 may overlap the second light-emitting element 320, and the third-color color filter layer 431 may overlap the third light-emitting element 330.

The first-color color filter layer 411 may transmit only light of a wavelength of 450 nm to 495 nm, the second-color color filter layer 421 may transmit only light of a wavelength of 495 nm to 570 nm, and the third-color color filter layer 431 may transmit only light of a wavelength of 630 nm to 780 nm. The first-color color filter layer 411, the second-color color filter layer 421, and the third-color color filter layer 431 may reduce external light reflection in the display apparatus 1.

For example, in case that external light arrives at the first-color color filter layer 411, only light of a preset wavelength described above may pass through the first-color color filter layer 411 and light of other wavelengths may be absorbed by the first-color color filter layer 411. Accordingly, of the external light incident on the display apparatus 1, only light of a preset wavelength described above may pass through the first-color color filter layer 411 and a portion of the light may be reflected from a conductive layer, for example, a counter electrode or a pixel electrode, thereunder, and be emitted to the outside. As a result, as only a portion of the external light incident on a position where the first light-emitting element 310 is located may be reflected to the outside, the external light reflection may be reduced. The same description may be applied to the second-color color filter layer 421 and the third-color color filter layer 431.

In an embodiment, as illustrated in FIG. 4, when viewed from the direction (±z directions) perpendicular to the second substrate 400, the first-color color filter layer 411 and the second-color color filter layer 421 may at least partially overlap each other, and the second-color color filter layer 421 and the third-color color filter layer 431 may at least partially overlap each other.

A third-1-color color filter pattern 431*pa* and a second-1-color color filter pattern 421*pa* may be sequentially disposed in a side of the first-color color filter layer 411. A third-2-color color filter pattern 431*pb* may be disposed in another side of the first-color color filter layer 411 that at least partially overlaps the second-color color filter layer 421. The third-2-color color filter pattern 431*pb* may be between the first-color color filter layer 411 and the second-color color filter layer 421. The second-1-color color filter pattern 421*pa* may function in the same way as the second-color color filter layer 421, and the third-1-color color filter pattern 431*pa* and the third-2-color color filter pattern 431*pb* may function in the same way as the third-color color filter layer 431. A side of the first-color color filter layer 411, the third-1-color color filter pattern 431*pa*, and the second-1-color color filter pattern 421*pa*, which overlap one another in the ±z directions, may function in the same way as a black matrix including carbon black and/or the like. Another side of the first-color color filter layer 411, the third-2-color color filter pattern 431*pb*, and a side of the second-color color filter layer 421, which overlap one another in the ±z directions, may function in the same way as a black matrix.

A first-1-color color filter pattern 411*pa* may be between a side of the third-color color filter layer 431 that at least partially overlaps the second-color color filter layer 421, and the second substrate 400. A first-2-color color filter pattern

411*pb* may be between another side of the third-color color filter layer 431 and the second substrate 400, and a second-2-color color filter pattern 421*pb* may be disposed in another side of the third-color color filter layer 431. The first-1-color color filter pattern 411*pa* and the first-2-color color filter pattern 411*pb* may function in the same way as the first-color color filter layer 411, and the second-2-color color filter pattern 421*pb* may function in the same way as the second-color color filter layer 421. The first-1-color color filter pattern 411*pa*, a side of the third-color color filter layer 431, and another side of the second-color color filter layer 421, which overlap one another in the ±z directions, may function in the same way as a black matrix. The first-2-color color filter pattern 411*pb*, another side of the third-color color filter layer 431, and the second-2-color color filter pattern 421*pb*, which overlap one another in the ±z directions, may function in the same way as a black matrix.

The low-refractive-index layer 403 may be disposed on the first-color color filter layer 411, the second-color color filter layer 421, and the third-color color filter layer 431 to correspond to the first light-emitting element 310, the second light-emitting element 320, and the third light-emitting element 330, respectively. The first barrier layer 405 may be disposed on the low-refractive-index layer 403, and the first capping layer 407 may be disposed on the first barrier layer 405. In other words, the first barrier layer 405 may be between the low-refractive-index layer 403 and the first capping layer 407.

Figure 5:
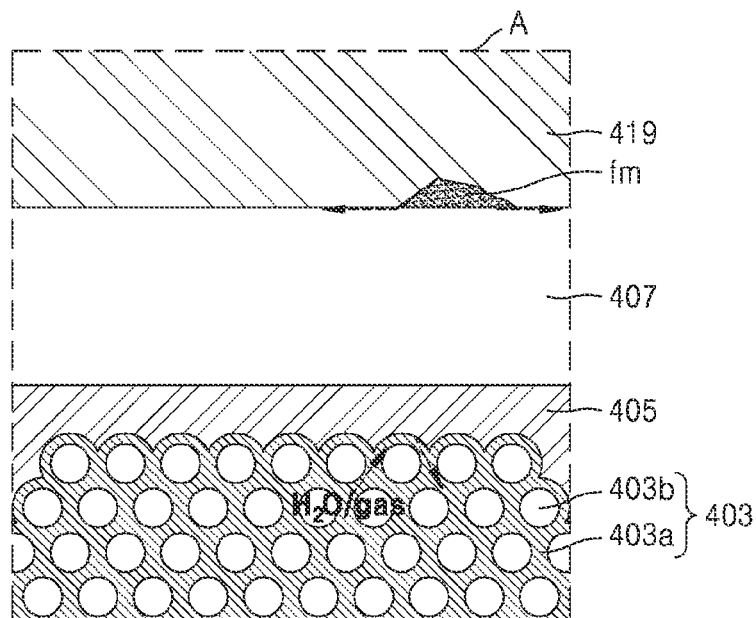
FIG. 5 is an enlarged schematic view of region A of FIG. 4.
Figure 5:
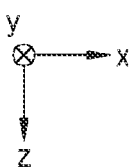

The refractive index of the low-refractive-index layer 403 may be less than the refractive index of the first capping layer 407. In case that the first capping layer 407 includes an inorganic material, such as a silicon oxide, a silicon nitride, a silicon oxynitride, and/or the like, the refractive index of the first capping layer 407 may be about 1.4 to about 1.5. The refractive index of the low-refractive-index layer 403, which may be less than the refractive index of the first capping layer 407, may be, for example, 1.1 to 1.3. The low-refractive-index layer 403 may include a matrix portion 403*a* and multiple particles 403*b* in the matrix portion 403*a*, which are described below as illustrated in FIG. 5.

The matrix portion 403*a* may include a polymer material. The matrix portion 403*a* may include at least one of an acrylic polymer, a silicon-based polymer, a urethane-based polymer, and an imide-based polymer. For example, the matrix portion 403*a* may include any one polymer material selected from among an acrylic polymer, a silicon-based polymer, a urethane-based polymer, and an imide-based polymer, or a combination of polymer materials selected therefrom. Furthermore, the matrix portion 403*a* may include at least one of a siloxane polymer, a silsesquioxane polymer, an acrylic polymer substituted with fluorine atoms, a silicon-based polymer substituted with fluorine atoms, a urethane-based polymer substituted with fluorine atoms, and an imide-based polymer substituted with fluorine atoms. The matrix portion 403*a* may include siloxane, acryl, polyimide, urethane, or epoxy. The matrix portion 403*a* may be formed by solidifying polymer resin, such as siloxane, acryl, polyimide, urethane, epoxy, or the like, in a high temperature process or an ultraviolet processing process.

The particles 403*b* in the matrix portion 403*a* may be silica. If necessary, the particles 403*b* may have a coating layer including an inorganic material and formed on surfaces thereof. The coating layer may include a silicon oxide or magnetite ($Fe_3O_4$). In other embodiments, the particles 403*b* may be hollow particles filled with air. In case that the particles 403*b* are hollow particles, the coating layer may include a silicon oxide, acryl, polyimide, urethane, styrene, or epoxy. The refractive index of the particles 403b may be, for example, 1.1 or more and 1.3 or less. The refractive index of the low-refractive-index layer 403 may be adjusted to be optimized by making the average diameter of the particles 403b included in the low-refractive-index layer 403 between 20 nm or more and 150 nm or less, and thus, the refractive index of the low-refractive-index layer 403 may be 1.1 or more and 1.3 or less.

The first barrier layer 405 between the low-refractive-index layer 403 and the first capping layer 407 may prevent or reduce the infiltration of impurities, for example, moisture or out-gas, from the low-refractive-index layer 403 and/or the like into the quantum dot layers. Furthermore, the first barrier layer 405 may prevent or reduce the infiltration of impurities, for example, a developer used in a photo process, from the first capping layer 407 and the like into the low-refractive-index layer 403.

The first barrier layer 405 may include a transparent organic material. The first barrier layer 405 may be a film including an organic material in a single layer or a multi-layer, and may provide a flat upper surface. The first barrier layer 405 may include a general purpose polymer, such as benzocyclobutene (BCB), polyimide, hexamethyldisiloxane (HMDSO), polymethylmethacrylate (PMMA), or polysty-rene (PS), polymer derivatives having a phenolic group, acrylic polymer, imide-based polymer, aryl ether-based polymer, amide-based polymer, fluorine-based polymer, p-xylene-based polymer, vinyl alcohol-based polymer, or blends thereof, and the like. In other embodiments, the first barrier layer 405 may include the same material as the matrix portion 403a described above.

The first capping layer 407 may have an integrated shape to correspond to the first light-emitting element 310, the second light-emitting element 320, and the third light-emitting element 330. The first capping layer 407 may include an inorganic material, such as a silicon oxide, a silicon nitride, a silicon oxynitride, and/or the like.

The light output layer 419 may be disposed on the first capping layer 407 to correspond to the first light-emitting element 310, the second-color quantum dot layer 429 may be disposed on the first capping layer 407 to correspond to the second light-emitting element 320, and the third-color quantum dot layer 439 may be disposed on the first capping layer 407 to correspond to the third light-emitting element 330. To this end, the first insulating layer 409 having openings corresponding to the first light-emitting element 310, the second light-emitting element 320, and the third light-emitting element 330 may be disposed on the first capping layer 407. The openings of the first insulating layer 409 corresponding to the first light-emitting element 310, the second light-emitting element 320, and the third light-emitting element 330 may mean that, when viewed from the direction (±z directions) perpendicular to the first substrate 100, the openings overlap the first light-emitting element 310, the second light-emitting element 320, and the third light-emitting element 330.

The first insulating layer 409 may include various materials, for example, an inorganic material, such as a silicon oxide, a silicon nitride, a silicon oxynitride, and/or the like. In other embodiments, the first insulating layer 409, as a black matrix, may be a member for enhancing color sharp-ness and contrast. The first insulating layer 409 may include at least one of a black pigment, a black dye, and a black particle. In some embodiments, the first insulating layer 409 may include a material, such as Cr, $CrO_X$, $Cr/CrO_X$, $Cr/CrO_X/CrN_Y$, resin (a carbon pigment or an RGB mixed pigment), graphite, and/or a non-Cr-based material.

As described above with reference to FIG. 3, the light output layer 419 may include the first photosensitive poly-mer 419c in which the first scattering particles 419b are dispersed, the second-color quantum dot layer 429 may include the second photosensitive polymer 429c in which the first quantum dots 429a and the second scattering particles 429b are dispersed, and the third-color quantum dot layer 439 may include the third photosensitive polymer 439c in which the second quantum dots 439a and the third scattering particles 439b are dispersed.

The second capping layer 413 may be disposed on the light output layer 419, the second-color quantum dot layer 429, and the third-color quantum dot layer 439. The second capping layer 413 may have an integrated shape to corre-spond to the first light-emitting element 310, the second light-emitting element 320, and the third light-emitting element 330. The second capping layer 413 may include an inorganic material, such as a silicon oxide, a silicon nitride, a silicon oxynitride, and/or the like.

Although, for convenience of explanation, the color filter CU is described in the stack order on the second substrate 400 (for example, in the −z direction), in case that the color filter CU is described with reference to the first substrate 100 (for example, in the +z direction), the stack order of the layers constituting the color filter unit CU may be expressed in reverse order. For example, the first capping layer 407 may be expressed as being disposed on the light output layer 419, the second-color quantum dot layer 429, and the third-color quantum dot layer 439 to correspond to the first light-emitting element 310, the second light-emitting element 320, and the third light-emitting element 330. The first barrier layer 405 may be expressed as being disposed on the first capping layer 407, and the low-refractive-index layer 403 may be expressed as being disposed on the first barrier layer 405. The first-color color filter layer 411 may be expressed as being disposed on the low-refractive-index layer 403 to correspond to the first light-emitting element 310, the second-color color filter layer 421 may be expressed as being disposed on the low-refractive-index layer 403 to correspond to the second light-emitting element 320, and the third-color color filter layer 431 may be expressed as being disposed on the low-refractive-index layer 403 to corre-spond to the third light-emitting element 330.

FIG. 5 is an enlarged schematic view of region A of FIG. 4. In detail, in FIG. 5, for convenience of explanation, the region A of FIG. 4 is shown in reverse with respect to the z axis.

Referring to FIG. 5, the first barrier layer 405 may be between the low-refractive-index layer 403 and the first capping layer 407. The surface of the low-refractive-index layer 403 may not be flat due to the particles 403b in the matrix portion 403a. The surface of the low-refractive-index layer 403 may be provided as a flat upper surface by covering the surface with the first barrier layer 405. As a flat upper surface may be provided by forming the first barrier layer 405 on the low-refractive-index layer 403, the forma-tion of a seam on the first capping layer 407 may be prevented. As no seam may be formed on the first capping layer 407, impurities fm from the first capping layer 407 and the like may be prevented from infiltrating into the low-refractive-index layer 403. Accordingly, the deformation of the low-refractive-index layer 403 due to the impurities fm may be prevented. The impurities fm may be, for example, the remainder of a developer, for example, potassium hydroxide (KOH), used in a photo process to form the first insulating layer 409 (see FIG. 4) after forming the first capping layer 407.

Furthermore, as the first barrier layer 405 may be formed on the low-refractive-index layer 403, moisture, out-gas, or the like from the low-refractive-index layer 403 and the like may be prevented from infiltrating into the quantum dot layers or the light output layer 419. Accordingly, the degradation of the quantum dot layers due to moisture, out-gas, or the like may be prevented.

Figure 6:
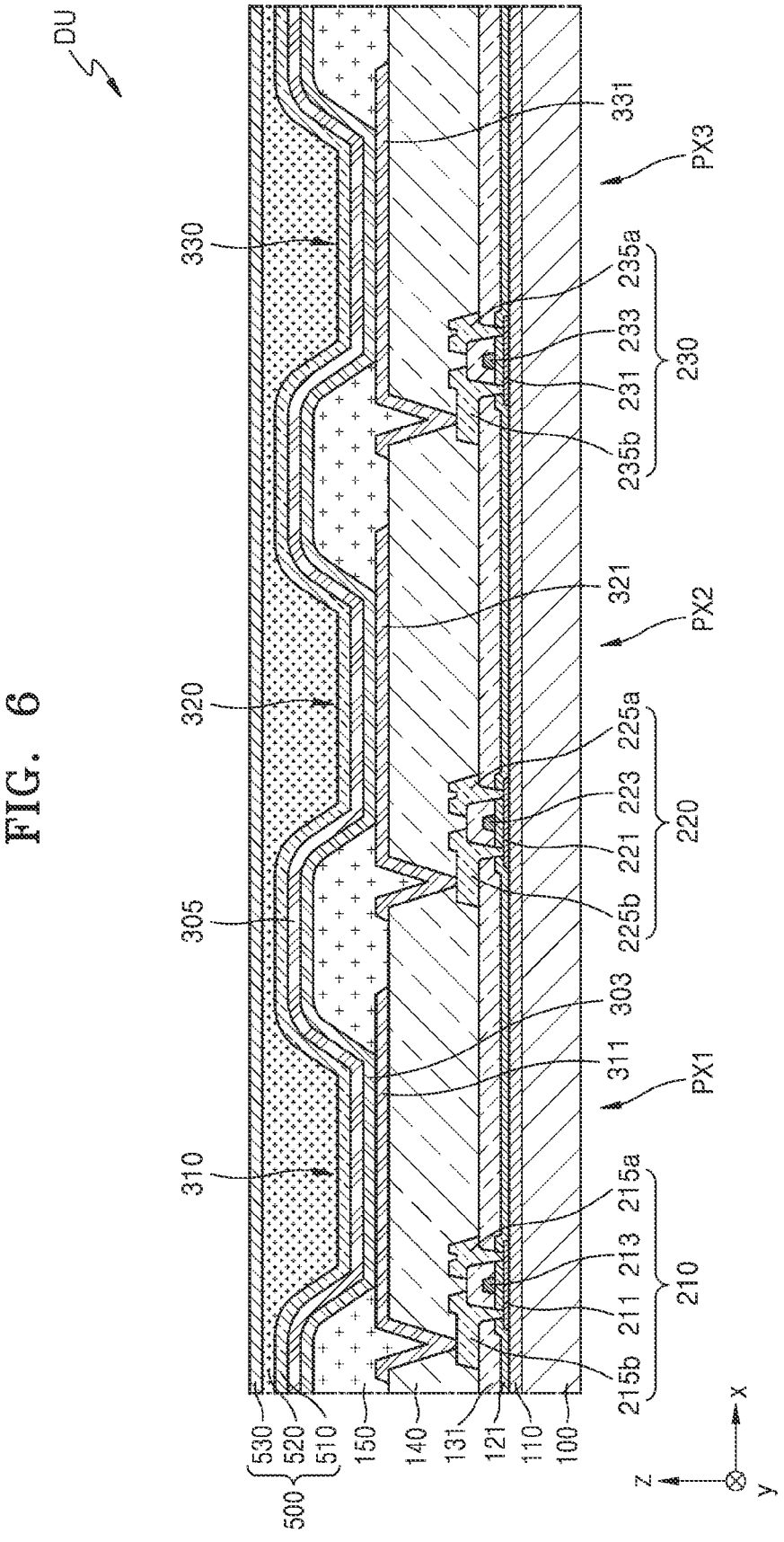
FIG. 6 is a schematic cross-sectional view showing a portion of a display unit according to an embodiment.

FIG. 6 is a schematic cross-sectional view showing a portion of the display unit DU according to an embodiment.

Referring to FIG. 6, the display unit DU according to an embodiment may include the first pixel PX1, the second pixel PX2, and the third pixel PX3. This is merely an example, and the display unit DU may include more pixels. Although FIG. 6 illustrates that the first pixel PX1, the second pixel PX2, and the third pixel PX3 are adjacent to one another, the disclosure is not limited thereto. In other words, constituent elements such as other wirings and the like may be between the first pixel PX1, the second pixel PX2, and the third pixel PX3. Accordingly, for example, the first pixel PX1 and the second pixel PX2 may not be pixels that are adjacent to each other. Furthermore, in FIG. 6, the cross-sections of the first pixel PX1, the second pixel PX2, and the third pixel PX3 may not be cross-sections in the same direction.

The display unit DU according to an embodiment may include the first substrate 100. The first substrate 100 may include glass, metal, and/or polymer resin. In case that the first substrate 100 is flexible or bendable, the first substrate 100 may include polymer resin, for example, polyethersulfone, polyacrylate, polyetherimide, polyethylene naphthalate, polyethylene terephthalate, polyphenylene sulfide, polyarylate, polyimide, polycarbonate, and/or cellulose acetate propionate. The first substrate 100 may be variously modified, for example, as a multilayer structure including two layers each including the polymer resin described above and a barrier layer between the layers and including an inorganic material, such as a silicon oxide, a silicon nitride, a silicon oxynitride, and/or the like.

A first pixel electrode 311, a second pixel electrode 321, and a third pixel electrode 331 may be arranged above the first substrate 100. In other words, multiple display devices, for example, the first to third light-emitting elements 310, 320, and 330, may be arranged above the first substrate 100. In addition to the display devices, first to third thin film transistors 210, 220, and 230 electrically connected to the display devices may be arranged above the first substrate 100. FIG. 6 illustrates that, as the display devices, organic light-emitting elements may be arranged above the first substrate 100. The organic light-emitting elements being electrically connected to the first to third thin film transistors 210, 220, and 230 may be understood as the first, second, and third pixel electrodes 311, 321, and 331 electrically connected to the first to third thin film transistors 210, 220, and 230, respectively.

For reference, in FIG. 6, the first thin film transistor 210 may be arranged in the first pixel PX1, the second thin film transistor 220 may be arranged in the second pixel PX2, the third thin film transistor 230 may be arranged in the third pixel PX3, and each of the first thin film transistor 210 to the third thin film transistor 230 may be electrically connected to the pixel electrode of the display device in the corresponding pixel. In the following description, for convenience of explanation, the first thin film transistor 210 and the display device connected thereto are described, which may be applied to the second thin film transistor 220 and the third thin film transistor 230 and the display devices connected thereto. In other words, the descriptions of a second semiconductor layer 221, a second gate electrode 223, a second source electrode 225a, and a second drain electrode 225b of the second thin film transistor 220, and the description of the second pixel electrode 321, are omitted. Likewise, the descriptions of a third semiconductor layer 231, a third gate electrode 233, a third source electrode 235a, and a third drain electrode 235b of the third thin film transistor 230, and the description of the third pixel electrode 331, are omitted.

The first thin film transistor 210 may include a first semiconductor layer 211 including amorphous silicon, polycrystalline silicon, an organic semiconductor material, and/or an oxide semiconductor material, a first gate electrode 213, a first source electrode 215a, and a first drain electrode 215b. The first gate electrode 213 may include various conductive materials and have various layered structures including, for example, a Mo layer and an Al layer. In other embodiments, the first gate electrode 213 may include a $TiN_x$ layer, an Al layer, and/or a Ti layer. The first source electrode 215a and the first drain electrode 215b may also include various conductive materials and have various layered structures including, for example, a Ti layer, an Al layer, and/or a Cu layer. For reference, the first semiconductor layer 211 may have a source region or a drain region, and as illustrated in FIG. 6, the first source electrode 215a or the first drain electrode 215b may be a wiring connected to a source region or a drain region of the first semiconductor layer 211.

To secure insulation between the first semiconductor layer 211 and the first gate electrode 213, a gate insulating film 121 including an inorganic material, such as a silicon oxide, a silicon nitride, a silicon oxynitride, and/or the like may be between the first semiconductor layer 211 and the first gate electrode 213. A first interlayer insulating film 131 including an inorganic material, such as a silicon oxide, a silicon nitride, a silicon oxynitride, and/or the like may be disposed on the first gate electrode 213, and the first source electrode 215a and the first drain electrode 215b may be disposed on the first interlayer insulating film 131. As such, the insulating film including an inorganic material may be formed by chemical vapor deposition (CVD) or atomic layer deposition (ALD).

A buffer layer 110 including an inorganic material, such as a silicon oxide, a silicon nitride, a silicon oxynitride, and/or the like may be between the first thin film transistor 210 and the first substrate 100 having the structure described above. The buffer layer 110 may increase smoothness of an upper surface of the first substrate 100 or prevent or reduce infiltration of impurities from the first substrate 100 and the like into the first semiconductor layer 211 of the first thin film transistor 210.

A planarization layer 140 may be disposed on the first thin film transistor 210. For example, as illustrated in FIG. 6, in case that an organic light-emitting element is disposed on the first thin film transistor 210, the planarization layer 140 may planarize an upper portion of a protective/passivation film covering the first thin film transistor 210. The planarization layer 140 may include, for example, an organic material, such as acryl, BCB, HMDSO, and/or the like. Although FIG. 6 illustrates the planarization layer 140 as a single layer, the planarization layer 140 may be variously modified, for example, as a multilayer and the like.

The display device may be arranged on the planarization layer 140 of the first substrate 100. The organic light-emitting element as illustrated in FIG. 6 may be used as the display device. For the first pixel PX1, the organic light-emitting element may include, for example, the first pixel electrode 311, a counter electrode 305, and an intermediate layer 303 between the first pixel electrode 311 and the counter electrode 305 and including an emission layer. The first pixel electrode 311, as illustrated in FIG. 6, may be electrically connected to the first thin film transistor 210 by contacting any one of the first source electrode 215a and the first drain electrode 215b via a contact hole formed in the planarization layer 140. The second pixel PX2 may have the second pixel electrode 321, and the third pixel PX3 may have the third pixel electrode 331. Each of the first pixel electrode 311 to the third pixel electrode 331 may include a transmissive conductive layer formed of a transmissive conductive oxide including indium tin oxide (ITO), indium oxide ($In_2O_3$), indium zinc oxide (IZO), or the like, and a reflective layer formed of a metal such as Al, Ag, and/or the like. For example, each of the first pixel electrode 311 to the third pixel electrode 331 may have a triple layer structure of ITO/Ag/ITO.

The intermediate layer 303 including the emission layer may be integrally formed across the first pixel electrode 311 to the third pixel electrode 331, and the counter electrode 305 on the intermediate layer 303 may be integrally formed across the first pixel electrode 311 to the third pixel electrode 331. The counter electrode 305 may include a transmissive conductive layer including ITO, $In_2O_3$, and/or IZO, and furthermore, a semi-transmissive film including a metal, such as Ag, Mg, Yb, and/or the like. For example, the counter electrode 305 may be a semi-transmissive film including MgAg and/or AgYb.

A pixel defining layer 150 may be disposed on the planarization layer 140. The pixel defining layer 150 may have an opening corresponding to each of pixels, for example, an opening that exposes at least a central portion of each of the first pixel electrode 311 to the third pixel electrode 331, thereby defining a pixel. Furthermore, in the case as illustrated in FIG. 6, the pixel defining layer 150 may prevent the generation of ark and the like in the edges of the first pixel electrode 311 to the third pixel electrode 331, by increasing a distance between the edge of each of the first pixel electrode 311 to the third pixel electrode 331 and the counter electrode 305. As such, the pixel defining layer 150 may include, for example, an organic material, such as polyimide, HMDSO, and/or the like.

The intermediate layer 303 may include a low molecular weight or polymer material. In case that the intermediate layer 303 includes a low molecular weight material, the intermediate layer 303 may have a stack structure of a hole injection layer (HIL), a hole transport layer (HTL), an emission layer (EML), an electron transport layer (ETL), an electron injection layer (EIL), and the like in a single or composite structure, and may be formed by a vacuum deposition method. In case that the intermediate layer 303 includes a polymer material, the intermediate layer 303 may have a structure including HTL and EML. The HTL may include poly(3,4-ethylene dioxythiophene) (PEDOT), and the EML may include a poly(p-phenylene vinylene (PPV)-based, polyfluorene-based, or the like polymer material. The intermediate layer 303 may be formed by screen printing, an inkjet printing method, a deposition method, laser induced thermal imaging (LITI), or the like. The intermediate layer 303 is not necessarily limited thereto, and may have various structures.

The intermediate layer 303 may include, as described above, an integrated layer across the first pixel electrode 311 to the third pixel electrode 331, but as necessary, may include a layer patterned to correspond to each of the first pixel electrode 311 to the third pixel electrode 331. In any case, the intermediate layer 303 may include the first-color emission layer. The first-color emission layer may be integrated across the first pixel electrode 311 to the third pixel electrode 331, and if necessary, may be patterned to correspond to each of the first pixel electrode 311 to the third pixel electrode 331. The first-color emission layer may emit light of a first wavelength range, for example, light of a wavelength of 450 nm to 495 nm.

The counter electrode 305 may be arranged on the intermediate layer 303 to correspond to the first pixel electrode 311 to the third pixel electrode 331. The counter electrode 305 may be integrally formed in multiple organic light-emitting elements.

As the organic light-emitting elements may be easily damaged by external moisture, oxygen, or the like, the encapsulation layer 500 may cover and protect the organic light-emitting elements. The encapsulation layer 500 may include a first inorganic encapsulation layer 510, an organic encapsulation layer 520, and a second inorganic encapsulation layer 530. The first inorganic encapsulation layer 510 and the second inorganic encapsulation layer 530 including an inorganic material, such as a silicon oxide, a silicon nitride, a silicon oxynitride, or the like may contact each other outside the organic encapsulation layer 520. The organic encapsulation layer 520 may include polydimethylsiloxane, polyacrylate, or the like.

Figure 7:
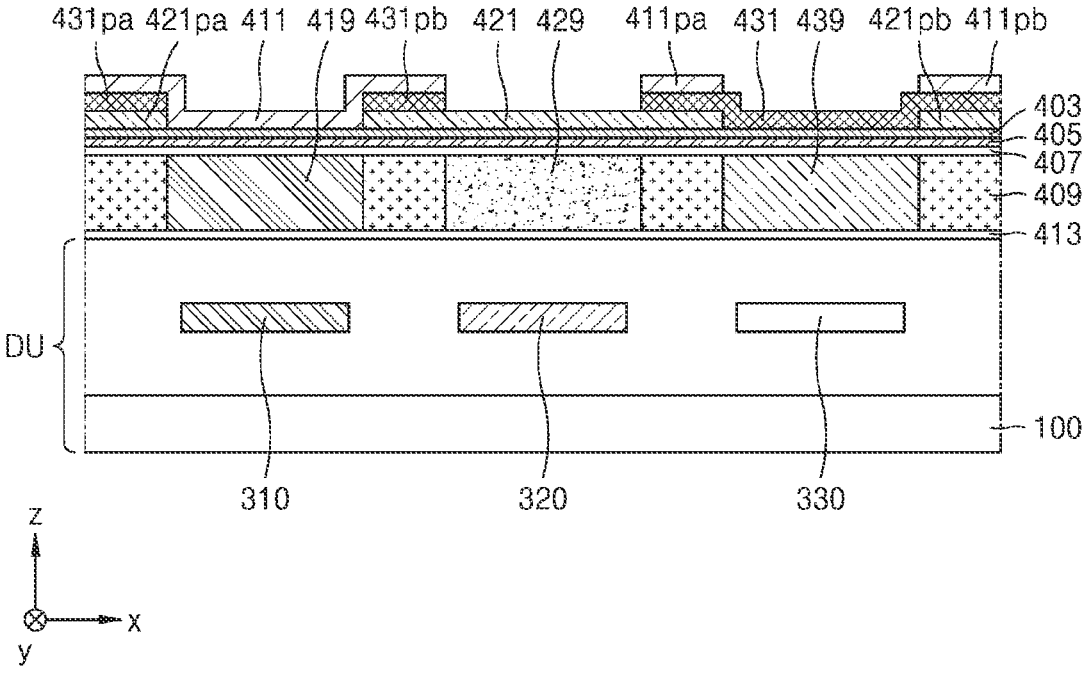
FIG. 7 is a schematic cross-sectional view showing a portion of a display apparatus according to an embodiment.

FIG. 7 is a schematic cross-sectional view showing a portion of the display apparatus 1 according to an embodiment. In FIGS. 4 and 7, like reference numerals denote like elements, and thus, redundant descriptions thereof are omitted.

Referring to FIG. 7, unlike FIG. 4 described above, the second substrate 400 may be omitted. Various layers constituting the color filter unit CU of FIG. 4 may be disposed on the display unit DU.

For example, as illustrated in FIG. 7, the second capping layer 413 may be disposed on the display unit DU, and the first insulating layer 409 may be disposed on the second capping layer 413. The light output layer 419 may be disposed on the second capping layer 413 to correspond to the first light-emitting element 310, the second-color quantum dot layer 429 may be disposed on the second capping layer 413 to correspond to the second light-emitting element 320, and the third-color quantum dot layer 439 may be disposed on the second capping layer 413 to correspond to the third light-emitting element 330. The first capping layer 407 may be disposed on the first insulating layer 409, the light output layer 419, the second-color quantum dot layer 429, and the third-color quantum dot layer 439. The first barrier layer 405 may be disposed on the first capping layer 407. The low-refractive-index layer 403 may be disposed on the first barrier layer 405. The first-color color filter layer 411 may be disposed on the low-refractive-index layer 403 to correspond to the first light-emitting element 310, the second-color color filter layer 421 may be disposed on the low-refractive-index layer 403 to correspond to the second light-emitting element 320, and the third-color color filter layer 431 may be disposed on the low-refractive-index layer 403 to correspond to the third light-emitting element 330.

Figure 8:
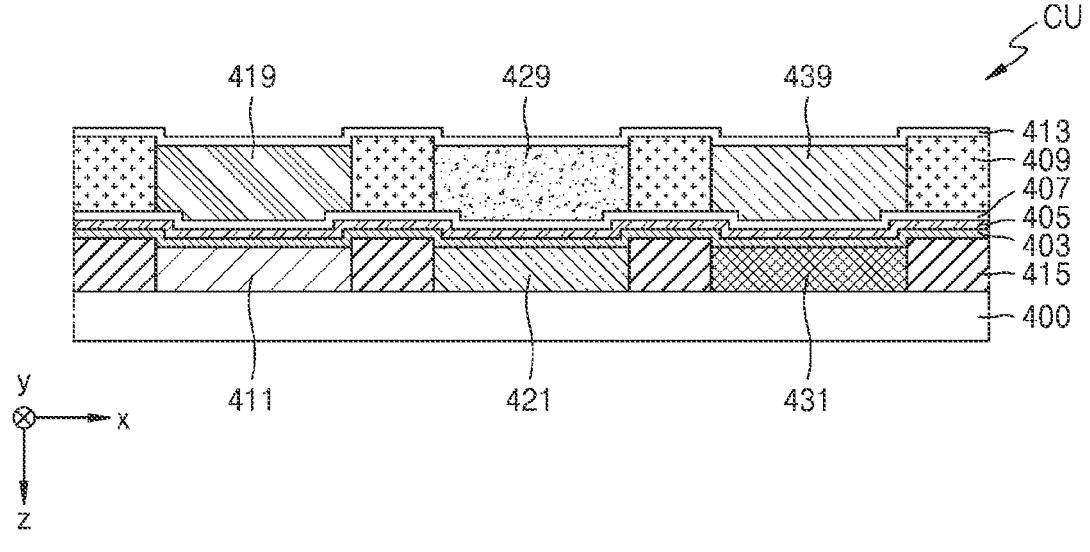
FIG. 8 is a schematic cross-sectional view showing a portion of a color filter unit according to an embodiment.

FIG. 8 is a schematic cross-sectional view showing a portion of the color filter unit CU according to an embodiment. In FIGS. 4 and 8, like reference numerals denote like elements, and redundant descriptions thereof are omitted.

Referring to FIG. 8, unlike FIG. 4 described above, the color filter unit CU may include a second insulating layer 415 disposed on the second substrate 400 (in the −z direction). Furthermore, the first-1-color color filter pattern 411*pa*, the first-2-color color filter pattern 411*pb*, the second-1-color color filter pattern 421*pa*, the second-2-color color filter pattern 421*pb*, the third-1-color color filter pattern 431*pa*, and the third-2-color color filter pattern 431*pb* may be omitted.

As described with reference to FIG. 4, the first-color color filter layer 411 may be disposed on the second substrate 400 to correspond to the first light-emitting element 310, the second-color color filter layer 421 may be disposed on the second substrate 400 to correspond to the second light-emitting element 320, and the third-color color filter layer 431 may be disposed on the second substrate 400 to correspond to the third light-emitting element 330. To this end, the second insulating layer 415 having openings corresponding to the first light-emitting element 310, the second light-emitting element 320, and the third light-emitting element 330 may be disposed on the second substrate 400.

The second insulating layer 415 may include various materials, for example, an inorganic material, such as a silicon oxide, a silicon nitride, a silicon oxynitride, and/or the like. In other embodiments, the second insulating layer 415, as a black matrix, may be a member for enhancing color sharpness and contrast. The second insulating layer 415 may include at least one of a black pigment, a black dye, and a black particle. In some embodiments, the second insulating layer 415 may include a material, such as Cr, $CrO_X$, $Cr/CrO_X$, $Cr/CrO_X/CrN_Y$, resin (a carbon pigment or an RGB mixed pigment), graphite, a non-Cr-based material, and/or the like.

Figure 9:
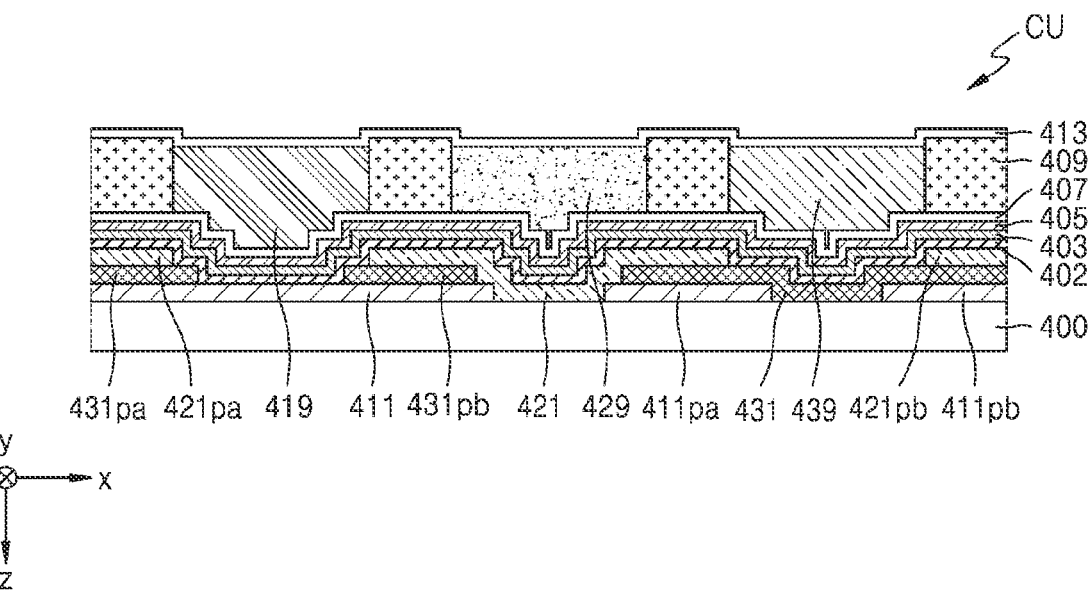
FIG. 9 is a schematic cross-sectional view showing a portion of a color filter unit according to an embodiment.

FIG. 9 is a schematic cross-sectional view showing a portion of the color filter unit CU according to an embodiment. In FIGS. 4 and 9, like reference numerals denote like elements, and redundant descriptions thereof are omitted.

Referring to FIG. 9, the color filter unit CU may include a third capping layer 402 between the low-refractive-index layer 403, and the first-color color filter layer 411, the second-color color filter layer 421, and the third-color color filter layer 431. The third capping layer 402 may protect the low-refractive-index layer 403.

The third capping layer 402 may have an integrated shape to correspond to the first light-emitting element 310, the second light-emitting element 320, and the third light-emitting element 330 of FIG. 4 that are described above. The third capping layer 402 may include an inorganic material, such as a silicon oxide, a silicon nitride, a silicon oxynitride, and/or the like.

Figure 10:
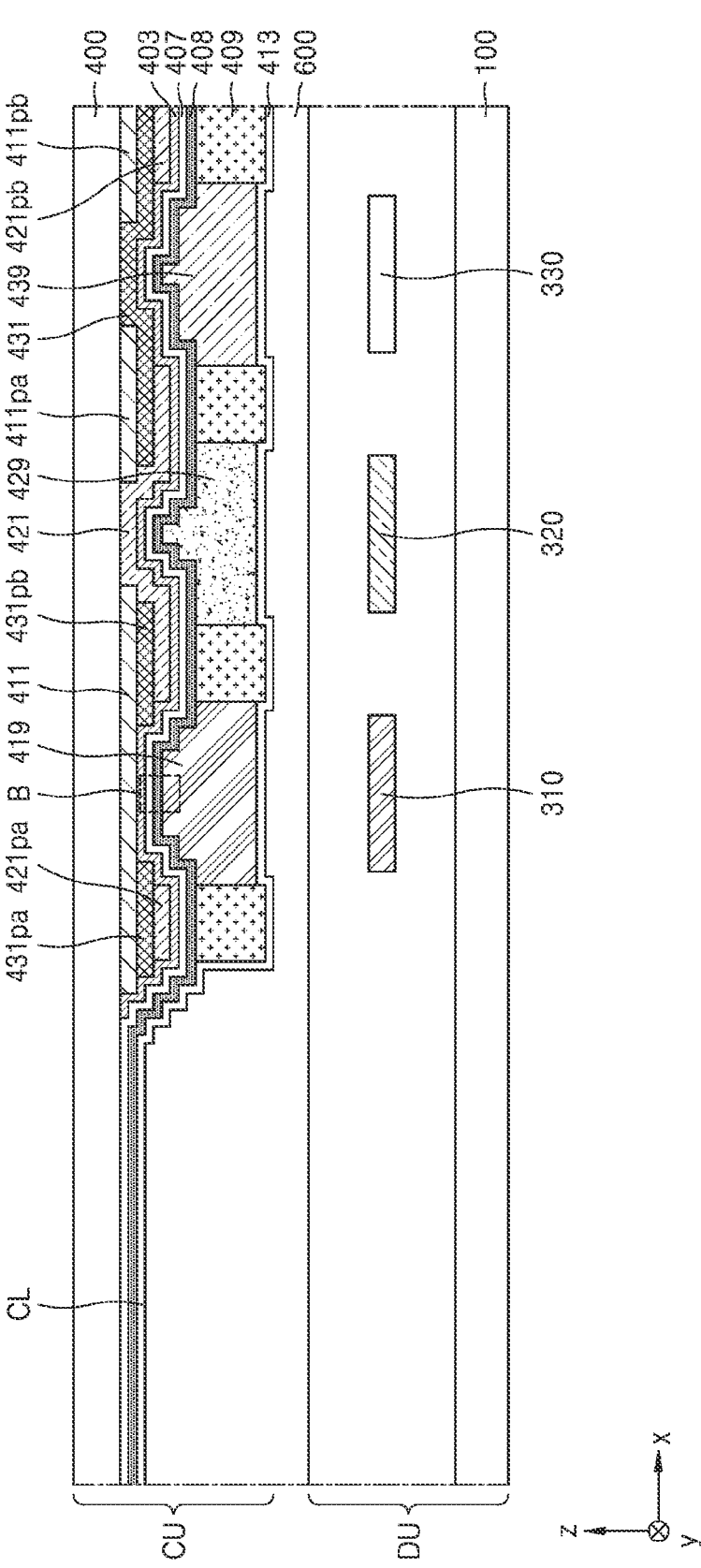
FIG. 10 is a schematic cross-sectional view showing a portion of a display apparatus according to an embodiment.

FIG. 10 is a schematic cross-sectional view showing a portion of the display apparatus 1 according to an embodiment. In FIGS. 4 and 10, like reference numerals denote like elements, and redundant descriptions thereof are omitted.

Referring to FIG. 10, unlike FIG. 4 described above, the color filter unit CU may include a second barrier layer 408 between the first capping layer 407, and the light output layer 419, the second-color quantum dot layer 429, and the third-color quantum dot layer 439, and a conductive line CL electrically connected to the second barrier layer 408. Furthermore, the first barrier layer 405 may be omitted.

The second barrier layer 408 may prevent or reduce impurities, for example, moisture or out-gas, from the low-refractive-index layer 403 and the like from infiltrating into the quantum dot layers. Furthermore, the second barrier layer 408 may prevent or reduce impurities, for example, a developer used in a photo process, from the first capping layer 407 and the like from infiltrating into the low-refractive-index layer 403.

The second barrier layer 408 may include a transparent conductive material. The second barrier layer 408 may be a (semi-)transmissive electrode or a reflective electrode. In some embodiments, the second barrier layer 408 may include a reflective layer including Ag, Mg, Al, Pt, Pd, Au, Ni, Nd, Ir, Cr, a compound thereof, and/or the like, and a transparent or semi-transparent electrode layer on the reflective layer. The transparent or semi-transparent electrode layer may include at least one selected from the group consisting of ITO, IZO, ZnO, $In_2O_3$, indium gallium oxide (IGO), and aluminum zinc oxide (AZO). In some embodiments, the second barrier layer 408 may include ITO/Ag/ITO.

In other embodiments, the second barrier layer 408 may include an oxide semiconductor material. The second barrier layer 408 may include, for example, at least one oxide selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an example, the second barrier layer 408 may be an ITZO (InSnZnO) semiconductor layer, an IGZO (InGaZnO) semiconductor layer, and/or the like. The second barrier layer 408 including an oxide semiconductor material may become n+ so as to have conductivity.

The conductive line CL may be electrically connected to the second barrier layer 408. The conductive line CL may extend in a direction. For example, the conductive line CL may substantially extend from the display area DA toward the peripheral area PA in FIG. 1 described above. The conductive line CL may include the same material as the second barrier layer 408.

Although FIG. 10 illustrates that the conductive line CL is integrally formed with the second barrier layer 408, in another embodiment, the conductive line CL and the second barrier layer 408 may be separately formed.

As described below with reference to FIG. 20, a bias voltage Vb may be applied to the second barrier layer 408 via the conductive line CL. As the bias voltage Vb may be applied to the second barrier layer 408, a repulsive force may act between the scattering particles over the second barrier layer 408 (in the −z direction), and thus, the scattering particles may be dispersed. The luminance distribution of the display apparatus 1 may be improved due to the dispersion of scattering particles.

Figure 11:
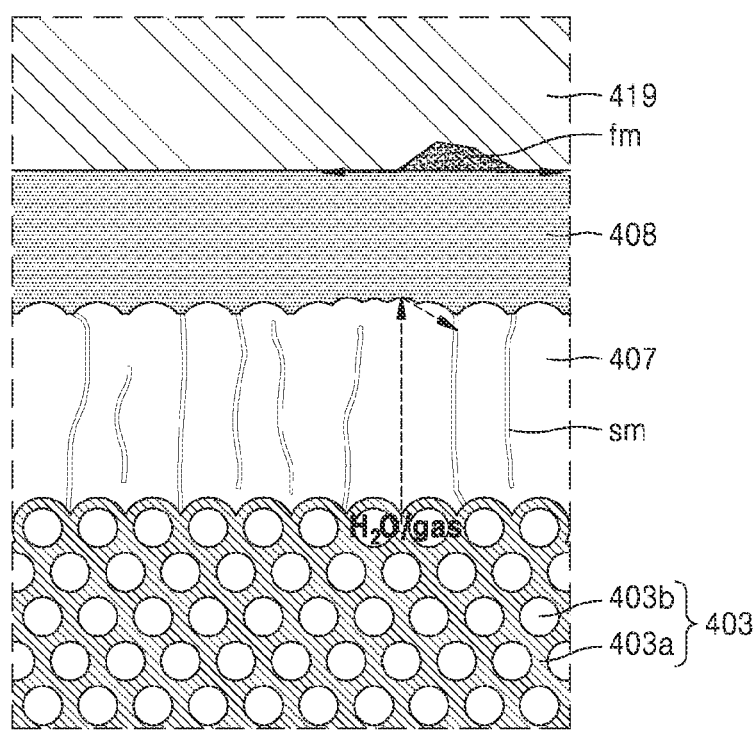
FIG. 11 is an enlarged schematic view of region B of FIG. 10.
Figure 11:
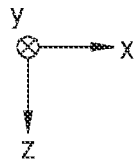

FIG. 11 is an enlarged schematic view of region B of FIG. 10. In detail, in FIG. 11, for convenience of explanation, the region B of FIG. 10 is shown in reverse with respect to the z axis.

Referring to FIG. 11, the second barrier layer 408 may be disposed between the light output layer 419 and the first capping layer 407. The surface of the low-refractive-index layer 403 may not be flat due to the particles 403*b* in the matrix portion 403*a*, and thus, a seam sm may be formed in the first capping layer 407 due to the surface of the low-refractive-index layer 403. The seam sm formed in the first capping layer 407 may serve as a movement path of moisture, out-gas, or the like from the low-refractive-index layer 403 and the like, the second barrier layer 408 may prevent the moisture, out-gas, or the like moving through the seam sm from infiltrating into the quantum dot layers or the light output layer 419. Accordingly, the degradation of the quantum dot layers due to moisture, out-gas, or the like may be prevented.

Furthermore, the second barrier layer 408 may prevent the impurities fm from infiltrating into the low-refractive-index layer 403. Accordingly, the deformation of the low-refractive-index layer 403 due to the impurities fm may be prevented. The impurities fm may be, for example, the remainder of a developer, for example, potassium hydroxide (KOH), used in a photo process to form the first insulating layer 409 (see FIG. 4) after forming the second barrier layer 408

Figure 12:
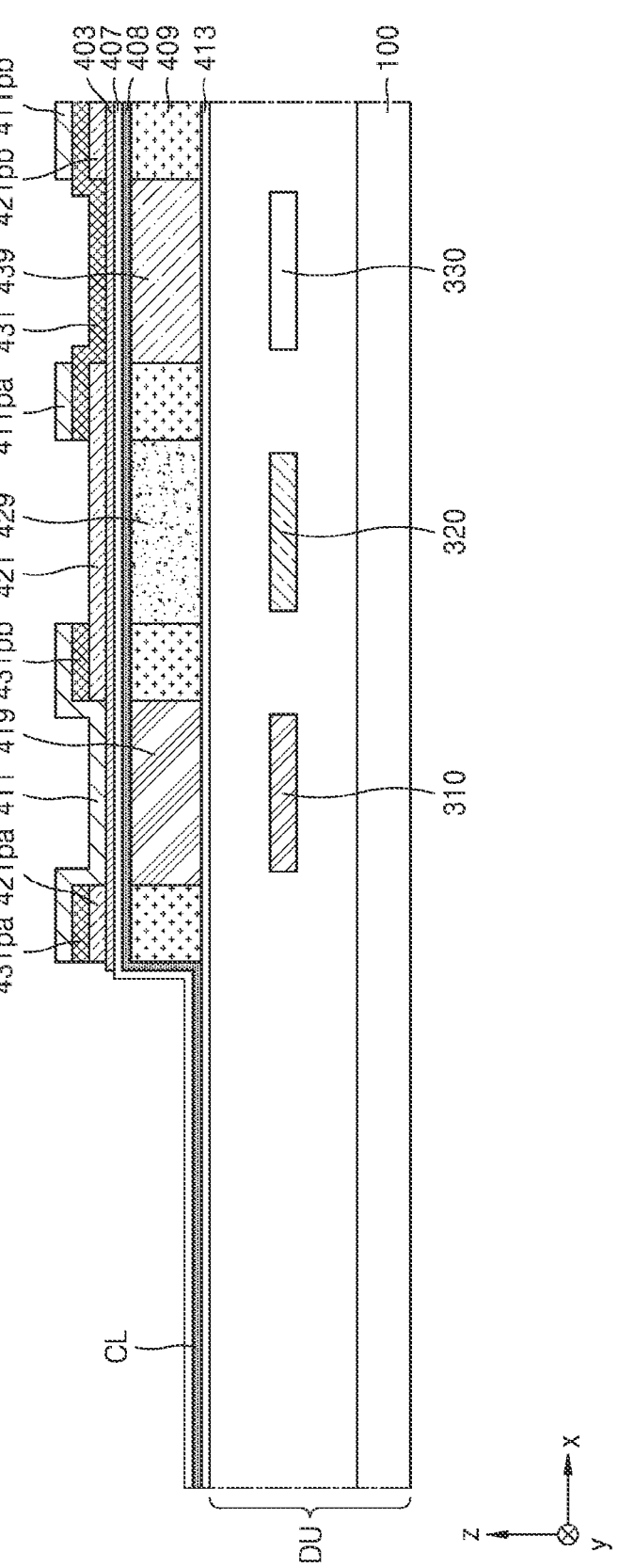
FIG. 12 is a schematic cross-sectional view showing a portion of a display apparatus according to an embodiment.

FIG. 12 is a schematic cross-sectional view showing a portion of the display apparatus 1 according to an embodiment. In FIGS. 4, 10, and 12, like reference numerals denote like elements, and redundant descriptions thereof are omitted.

Referring to FIG. 12, unlike FIG. 10 described above, the second substrate 400 may be omitted. Various layers constituting the color filter unit CU of FIG. 10 may be disposed on the display unit DU.

For example, as illustrated in FIG. 12, the second capping layer 413 may be disposed on the display unit DU, and the first insulating layer 409 may be disposed on the second capping layer 413. The light output layer 419 may be disposed on the second capping layer 413 to correspond to the first light-emitting element 310, the second-color quantum dot layer 429 may be disposed on the second capping layer 413 to correspond to the second light-emitting element 320, and the third-color quantum dot layer 439 may be disposed on the second capping layer 413 to correspond to the third light-emitting element 330. The second barrier layer 408 may be disposed on the first insulating layer 409, the light output layer 419, the second-color quantum dot layer 429, and the third-color quantum dot layer 439. The first capping layer 407 may be disposed on the second barrier layer 408. The low-refractive-index layer 403 may be disposed on the first capping layer 407. The first-color color filter layer 411 may be disposed on the low-refractive-index layer 403 to correspond to the first light-emitting element 310, the second-color color filter layer 421 may be disposed on the low-refractive-index layer 403 to correspond to the second light-emitting element 320, and the third-color color filter layer 431 may be disposed on the low-refractive-index layer 403 to correspond to the third light-emitting element 330.

Figure 13:
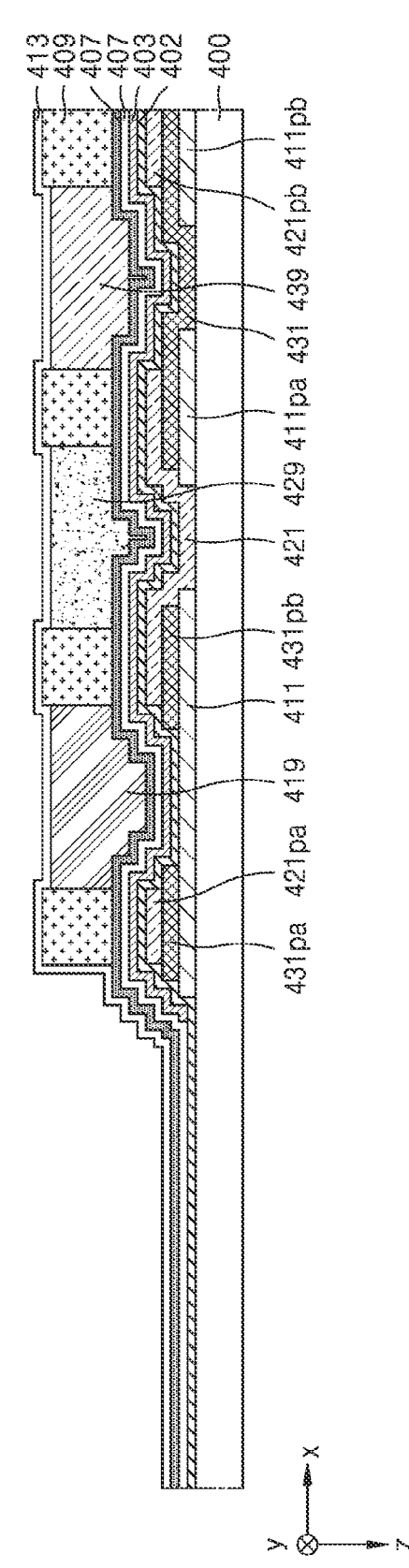
FIG. 13 is a schematic cross-sectional view showing a portion of a color filter unit according to an embodiment.

FIG. 13 is a schematic cross-sectional view showing a portion of the color filter unit CU according to an embodiment. In FIGS. 4, 10, and 13, like reference numerals denote like elements, and redundant descriptions thereof are omitted.

Referring to FIG. 13, the color filter unit CU may include the third capping layer 402 between the low-refractive-index layer 403, and the first-color color filter layer 411, the second-color color filter layer 421, and the third-color color filter layer 431. The third capping layer 402 may protect the low-refractive-index layer 403.

The third capping layer 402 may have an integrated shape to correspond to the first light-emitting element 310, the second light-emitting element 320, and the third light-emitting element 330 of FIG. 10 described above. The third capping layer 402 may include an inorganic material, such as a silicon oxide, a silicon nitride, a silicon oxynitride, and/or the like.

Figure 14:
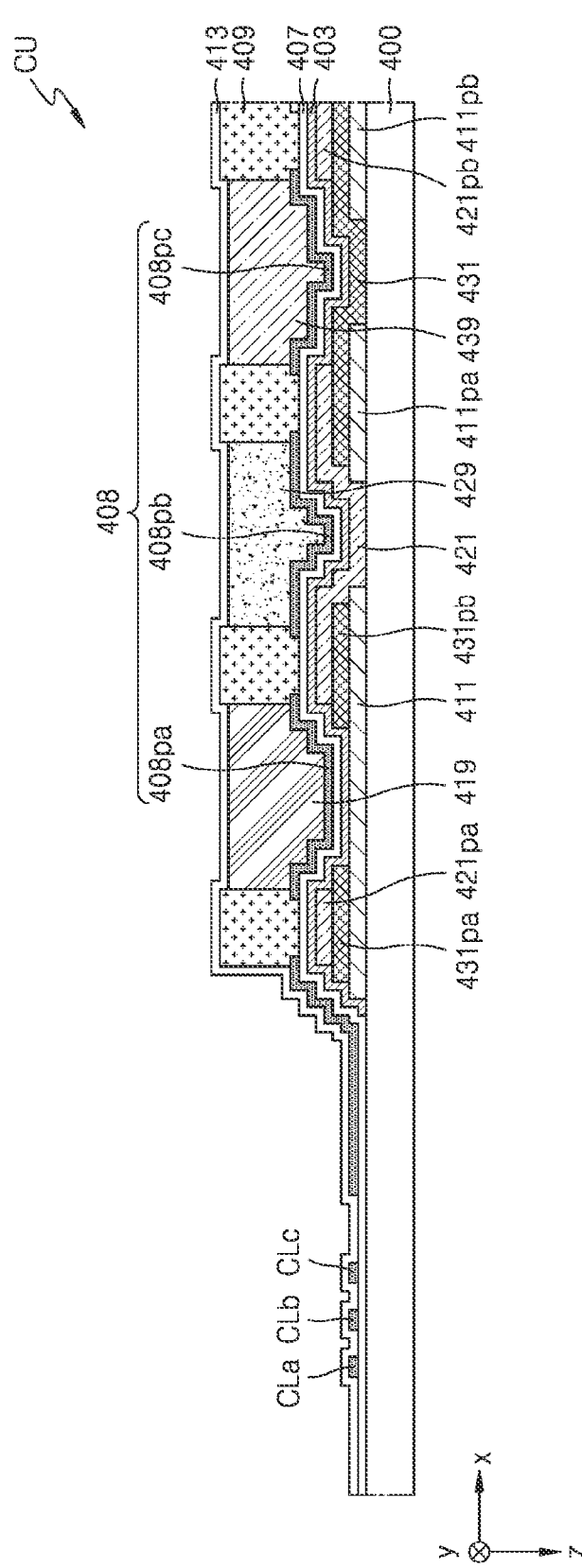
FIG. 14 is a schematic cross-sectional view showing a portion of a color filter unit according to an embodiment.

FIG. 14 is a schematic cross-sectional view showing a portion of the color filter unit CU according to an embodiment. In FIGS. 4, 10, and 14, like reference numerals denote like elements, and redundant descriptions thereof are omitted.

Referring to FIG. 14, unlike FIG. 10 described above, the second barrier layer 408 may include a first barrier pattern 408*pa*, a second barrier pattern 408*pb*, and a third barrier pattern 408*pc*, which may be apart from one another. The first barrier pattern 408*pa* may be between the light output layer 419 and the first capping layer 407, the second barrier pattern 408*pb* may be between the second-color quantum dot layer 429 and the first capping layer 407, and the third barrier pattern 408*pc* may be between the third-color quantum dot layer 439 and the first capping layer 407. As described above with reference to FIG. 4, as the light output layer 419, the second-color quantum dot layer 429, and the third-color quantum dot layer 439 correspond to the first light-emitting element 310, the second light-emitting element 320, and the third light-emitting element 330, respectively, the first barrier pattern 408*pa*, the second barrier pattern 408*pb*, and the third barrier pattern 408*pc* may correspond to the first light-emitting element 310, the second light-emitting element 320, and the third light-emitting element 330, respectively.

The color filter unit CU may include a first conductive line CLa, a second conductive line CLb, and a third conductive line CLc. The first conductive line CLa may be electrically connected to the first barrier pattern 408*pa*, the second conductive line CLb may be electrically connected to the second barrier pattern 408*pb*, and the third conductive line CLc may be electrically connected to the third barrier pattern 408*pc*. The first conductive line CLa, the second conductive line CLb, and the third conductive line CLc may include the same material as the second barrier layer 408.

As described below with reference to FIG. 15, the first conductive line CLa, the second conductive line CLb, and the third conductive line CLc may extend in a direction. For example, the first conductive line CLa, the second conductive line CLb, and the third conductive line CLc may substantially extend from the display area DA toward the peripheral area PA in FIG. 1 described above.

As described below with reference to FIG. 25, different bias voltages may be applied to the first barrier pattern 408*pa*, the second barrier pattern 408*pb*, and the third barrier pattern 408*pc*, through the first conductive line CLa, the second conductive line CLb, and the third conductive line CLc, respectively. The magnitude of each bias voltage may be based on the number density of scattering particles over each of the first barrier pattern 408*pa*, the second barrier pattern 408*pb*, and the third barrier pattern 408*pc* (in the −z direction). In case that different bias voltages are applied to the first barrier pattern 408*pa*, the second barrier pattern 408*pb*, and the third barrier pattern 408*pc*, respectively, a sufficient repulsive force may act between the scattering particles over each of the first barrier pattern 408*pa*, the second barrier pattern 408*pb*, and the third barrier pattern 408*pc*, and thus, the scattering particles may be dispersed. The luminance distribution of the display apparatus 1 may be improved due to the dispersion of the scattering particles.

Figure 15:
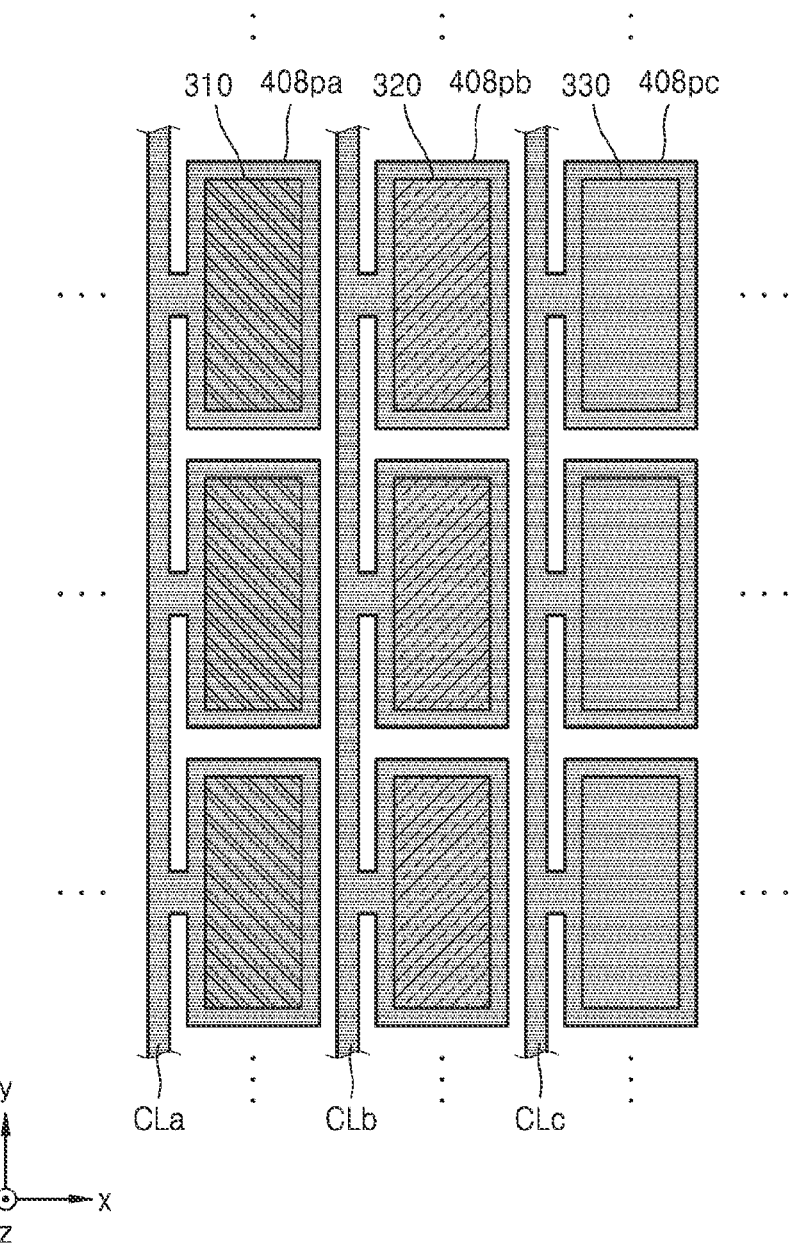
FIG. 15 is an enlarged schematic plan view showing a portion of a display apparatus according to an embodiment.

FIG. 15 is an enlarged schematic plan view showing a portion of the display apparatus 1 according to an embodiment.

Referring to FIG. 15, each of the first light-emitting element 310, the second light-emitting element 320, and the third light-emitting element 330 may include multiple light-emitting elements. The first light-emitting elements 310, the second light-emitting elements 320, and the third light-emitting elements 330 may each be arranged in a direction, for example, ±y directions. The first light-emitting elements 310, the second light-emitting elements 320, and the third light-emitting elements 330 may each be arranged in stripes. Although FIG. 15 illustrates that the first light-emitting elements 310, the second light-emitting elements 320, and the third light-emitting elements 330 are arranged in stripes, the disclosure is not limited thereto, and the first light-emitting elements 310, the second light-emitting elements 320, and the third light-emitting elements 330 may be arranged in various types, such as an s-stripe type, a Pen-Tile® type, and/or the like.

The first barrier pattern 408pa, the second barrier pattern 408pb, and the third barrier pattern 408pc may each include multiple barrier patterns. The first barrier patterns 408pa may correspond to the first light-emitting elements 310, the second barrier patterns 408pb may correspond to the second light-emitting elements 320, and the third barrier patterns 408pc may correspond to the third light-emitting elements 330. The first barrier patterns 408pa corresponding to the first light-emitting elements 310 may mean that the first barrier patterns 408pa overlap the pixel electrodes of the first light-emitting elements 310. The description of the first barrier pattern 408pa may be identically applied to the second barrier pattern 408pb and the third barrier pattern 408pc.

The first barrier patterns 408pa may be electrically connected to the first conductive line CLa extending in a direction, the second barrier patterns 408pb may be electrically connected to the second conductive line CLb extending in a direction, and the third barrier patterns 408pc may be electrically connected to the third conductive line CLc extending in a direction.

Although FIG. 15 illustrates that the first conductive line CLa is integrally formed with the first barrier patterns 408pa, the second conductive line CLb is integrally formed with the second barrier patterns 408pb, and the third conductive line CLc is integrally formed with the third barrier patterns 408pc, in another embodiment, the first conductive line CLa and the first barrier patterns 408pa, the second conductive line CLb and the second barrier patterns 408pb, and the third conductive line CLc and the third barrier patterns 408pc may each be formed separately from each other.

Figure 16:
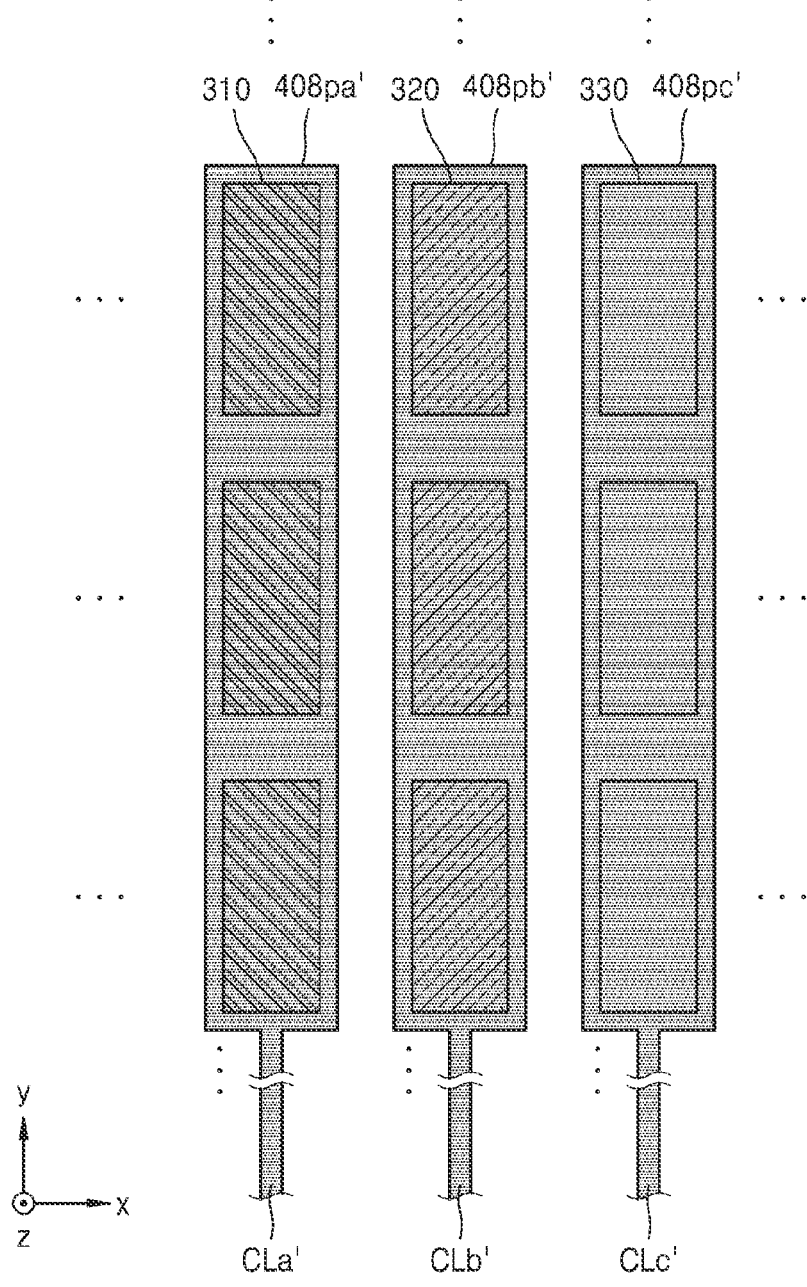
FIG. 16 is an enlarged schematic plan view showing a portion of a display apparatus according to an embodiment.

FIG. 16 is an enlarged schematic plan view showing a portion of the display apparatus 1 according to an embodiment.

Referring to FIG. 16, each of the first light-emitting element 310, the second light-emitting element 320, and the third light-emitting element 330 may include multiple light-emitting elements. Each of the first light-emitting elements 310, the second light-emitting elements 320, and the third light-emitting elements 330 may be arranged in a direction, for example, the ±y directions. The first light-emitting elements 310, the second light-emitting elements 320, and the third light-emitting elements 330 may be arranged in stripes. Although FIG. 16 illustrates that the first light-emitting elements 310, the second light-emitting elements 320, and the third light-emitting elements 330 are arranged in stripes, the disclosure is not limited thereto, and the first light-emitting elements 310, the second light-emitting elements 320, and the third light-emitting elements 330 may be arranged in various types, such as an s-stripe type, a Pen-Tile® type, or the like.

A first barrier pattern 408pa' may correspond to the first light-emitting elements 310, a second barrier pattern 408pb' may correspond to the second light-emitting elements 320, and a third barrier pattern 408pc' may correspond to the third light-emitting elements 330. The first barrier pattern 408pa' corresponding to the first light-emitting elements 310 may mean that the first barrier pattern 408pa' overlaps the pixel electrodes of the first light-emitting elements 310. The description of the first barrier pattern 408pa' may be identically applied to the second barrier pattern 408pb' and the third barrier pattern 408pc'.

The first barrier pattern 408pa' may be electrically connected to a first conductive line CLa' extending in a direction, the second barrier pattern 408pb' may be electrically connected to a second conductive line CLb' extending in a direction, and the third barrier pattern 408pc' may be electrically connected to a third conductive line CLc' extending in a direction.

Although FIG. 16 illustrates that the first conductive line CLa' is integrally formed with the first barrier pattern 408pa', the second conductive line CLb' is integrally formed with the second barrier pattern 408pb', and the third conductive line CLc' is integrally formed with the third barrier pattern 408pc', in another embodiment, the first conductive line CLa' and the first barrier pattern 408pa', the second conductive line CLb' and the second barrier pattern 408pb', and the third conductive line CLc' and the third barrier pattern 408pc' may each be formed separately from each other.

Figure 17:
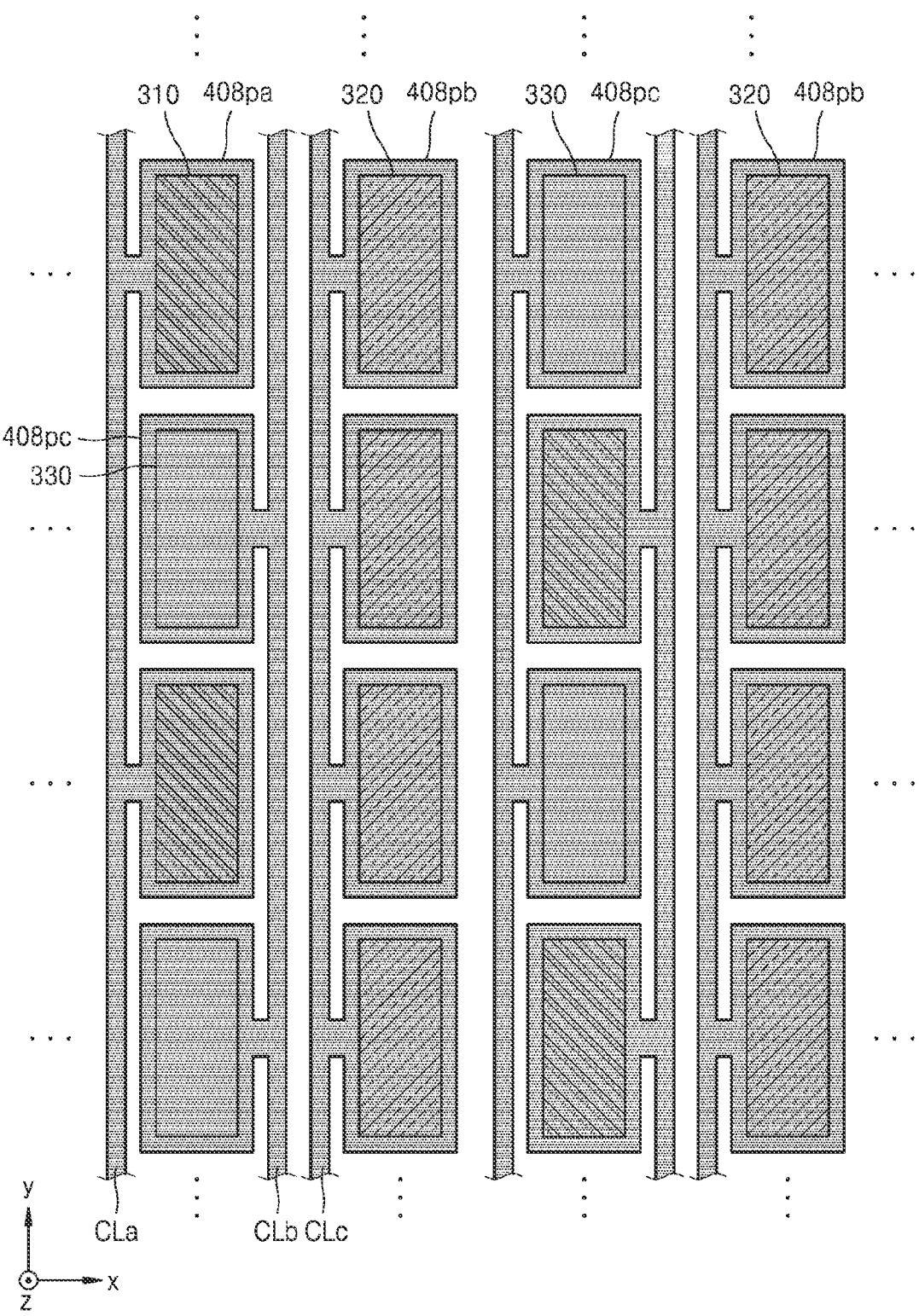
FIG. 17 is an enlarged schematic plan view showing a portion of a display apparatus according to an embodiment.

FIG. 17 is an enlarged schematic plan view showing a portion of the display apparatus 1 according to an embodiment.

Referring to FIG. 17, each of the first light-emitting element 310, the second light-emitting element 320, and the third light-emitting element 330 may include multiple light-emitting elements. Each of the first light-emitting elements 310, the second light-emitting elements 320, and the third light-emitting elements 330 may be arranged in a direction, for example, the ±y directions. The first light-emitting elements 310 and the third light-emitting elements 330 may be alternately arranged in a direction. The first light-emitting elements 310, the second light-emitting elements 320, and the third light-emitting elements 330 may be arranged in a PenTile® type.

Each of the first barrier pattern 408pa, the second barrier pattern 408pb, and the third barrier pattern 408pc may include multiple barrier patterns. The first barrier patterns 408pa may correspond to the first light-emitting elements 310, the second barrier patterns 408pb may correspond to the second light-emitting elements 320, and the third barrier patterns 408pc may correspond to the third light-emitting elements 330. The first barrier patterns 408pa corresponding to the first light-emitting elements 310 may mean that the first barrier patterns 408pa overlap the pixel electrodes of the first light-emitting elements 310. The description of the first barrier pattern 408pa may be identically applied to the second barrier pattern 408pb and the third barrier pattern 408pc.

The first barrier patterns 408pa may be electrically connected to the first conductive line CLa extending in a direction, the second barrier patterns 408pb may be electrically connected to the second conductive line CLb extending in a direction, and the third barrier patterns 408pc may be electrically connected to the third conductive line CLc extending in a direction.

Although FIG. 17 illustrates that the first conductive line CLa is integrally formed with the first barrier patterns 408pa, the second conductive line CLb is integrally formed with the second barrier patterns 408pb, and the third conductive line CLc is integrally formed with the third barrier patterns 408pc, in another embodiment, the first conductive line CLa and the first barrier patterns 408pa, the second conductive line CLb and the second barrier patterns 408pb, and the third conductive line CLc and the third barrier patterns 408pc may each be formed separately from each other.

Figure 18:
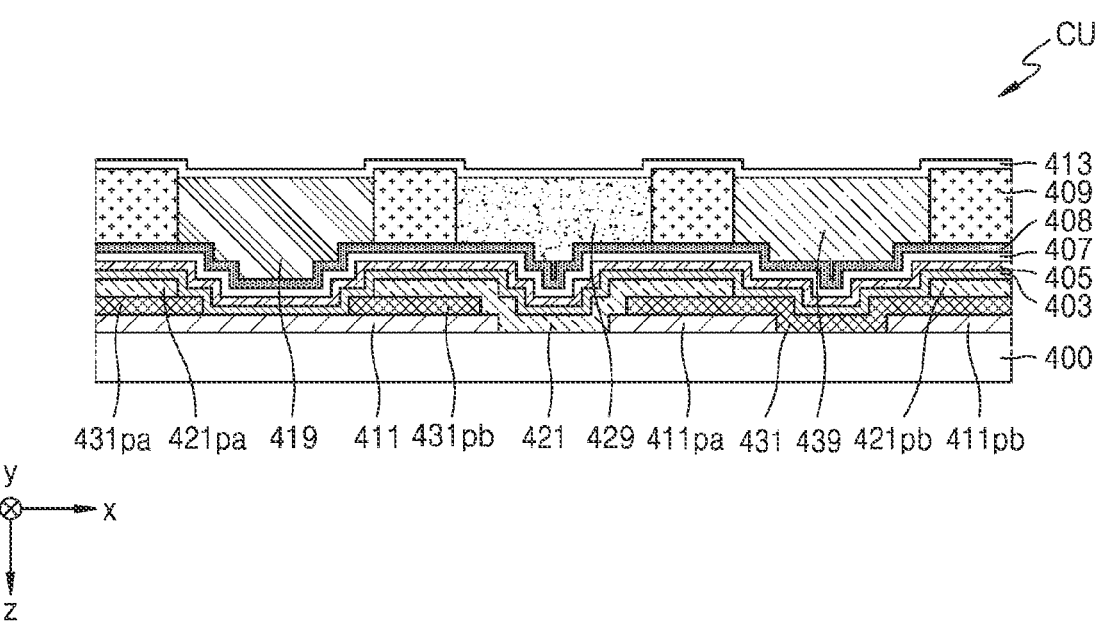
FIG. 18 is a schematic cross-sectional view showing a portion of a color filter unit according to an embodiment.

FIG. 18 is a schematic cross-sectional view showing a portion of the color filter unit CU according to an embodiment. In FIGS. 4, 10, and 18, like reference numerals denote like elements, and redundant descriptions thereof are omitted.

Referring to FIG. 18, the color filter unit CU of FIG. 10 described above may include the first barrier layer 405 of FIG. 4 described above. In other words, the color filter unit CU may include the first barrier layer 405 between the low-refractive-index layer 403 and the first capping layer 407, and the second barrier layer 408 between the first capping layer 407, and the light output layer 419, the second-color quantum dot layer 429, and the third-color quantum dot layer 439.

In an embodiment, the first barrier layer 405 and the second barrier layer 408 may include materials different from each other. For example, the first barrier layer 405 may include a transparent organic material, and the second barrier layer 408 may include a transparent conductive material.

Although FIG. 18 illustrates that the first barrier layer 405, the second barrier layer 408, and the like are arranged above the second substrate 400, in another embodiment, the second substrate 400 may be omitted, and the first barrier layer 405, the second barrier layer 408, and the like may be arranged above the display unit DU (see FIG. 2).

Furthermore, although not illustrated in FIG. 18, the third capping layer 402 of FIG. 13 described above may be between the low-refractive-index layer 403, and the first-color color filter layer 411, the second-color color filter layer 421, and the third-color color filter layer 431.

Figure 19:
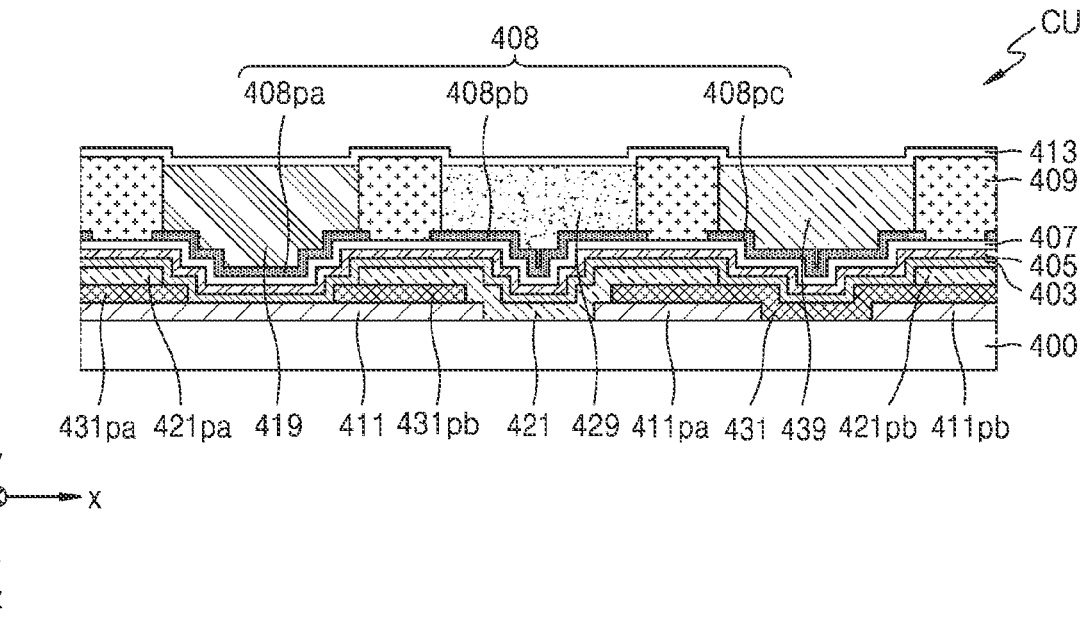
FIG. 19 is a schematic cross-sectional view showing a portion of a color filter unit according to an embodiment.

FIG. 19 is a schematic cross-sectional view showing a portion of the color filter unit CU according to an embodiment. In FIG. 19, FIGS. 4 and 10 and like reference numerals denote like elements, and redundant descriptions thereof are omitted.

Referring to FIG. 19, the color filter unit CU of FIG. 14 described above may include the first barrier layer 405 of FIG. 4 described above. In other words, the color filter unit CU may include the first barrier layer 405 between the low-refractive-index layer 403 and the first capping layer 407, the first barrier pattern 408$pa$ between the first capping layer 407, and the light output layer 419, the second barrier pattern 408$pb$ between the first capping layer 407 and the second-color quantum dot layer 429, and the third barrier pattern 408$pc$ between the first capping layer 407 and the third-color quantum dot layer 439.

In an embodiment, the first barrier layer 405 and the first to third barrier patterns 408$pa$, 408$pb$, and 408$pc$ may include materials different from each other. For example, the first barrier layer 405 may include a transparent organic material, and the first to third barrier patterns 408$pa$, 408$pb$, and 408$pc$ may include a transparent conductive material.

Although FIG. 19 illustrates that the first barrier layer 405, the first to third barrier patterns 408$pa$, 408$pb$, and 408$pc$, and the like are arranged above the second substrate 400, in another embodiment, the second substrate 400 may be omitted, and the first barrier layer 405, the first to third barrier patterns 408$pa$, 408$pb$, and 408$pc$, and the like may be arranged above the display unit DU (see FIG. 2).

Furthermore, although not illustrated in FIG. 19, the third capping layer 402 of FIG. 13 described above may be between the low-refractive-index layer 403, and the first-color color filter layer 411, the second-color color filter layer 421, and the third-color color filter layer 431.

Although the display apparatus 1 is described above, the disclosure is not limited thereto. For example, a method of manufacturing such a display apparatus may also be within the scope of the disclosure.

Figure 20:
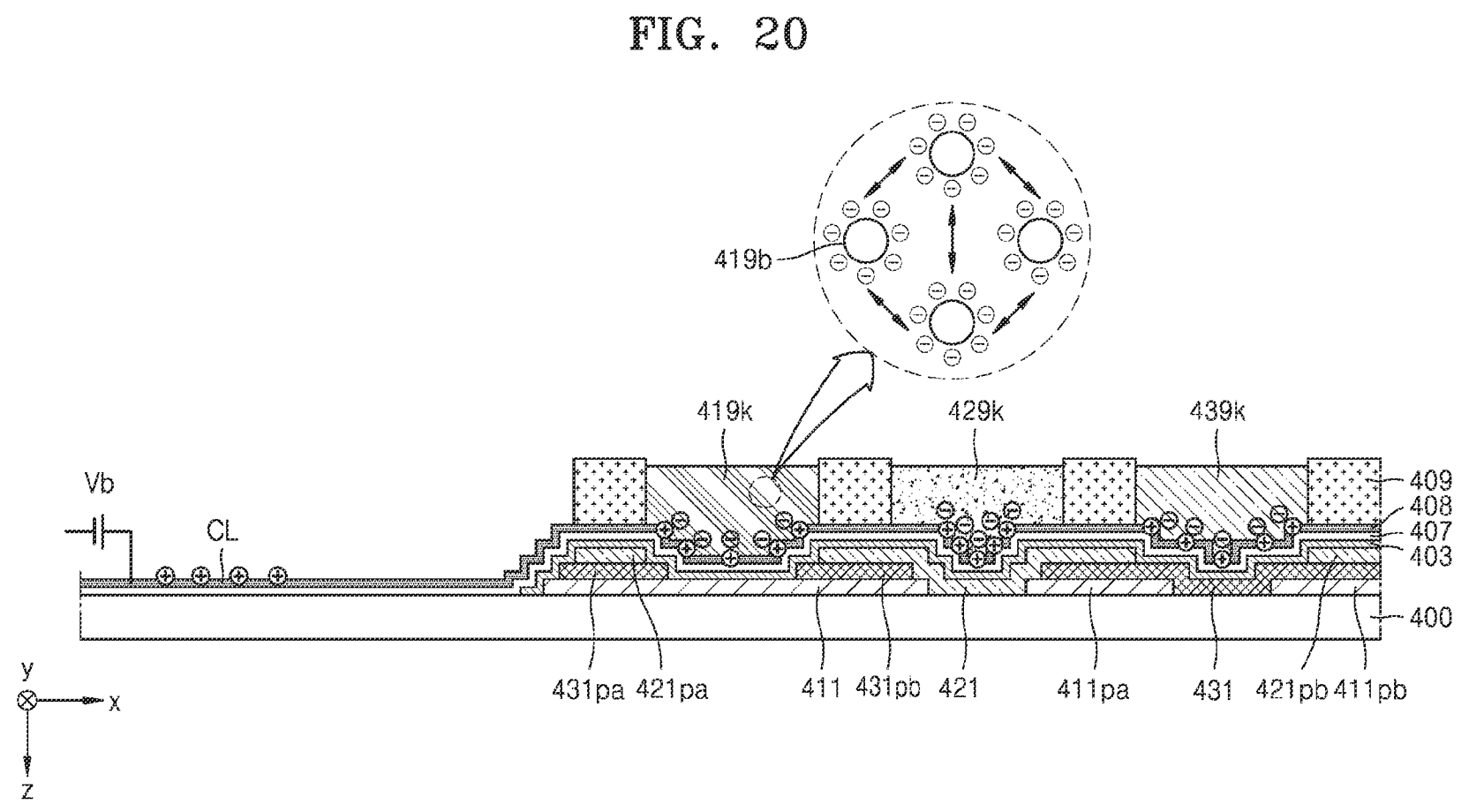
Figure 21:
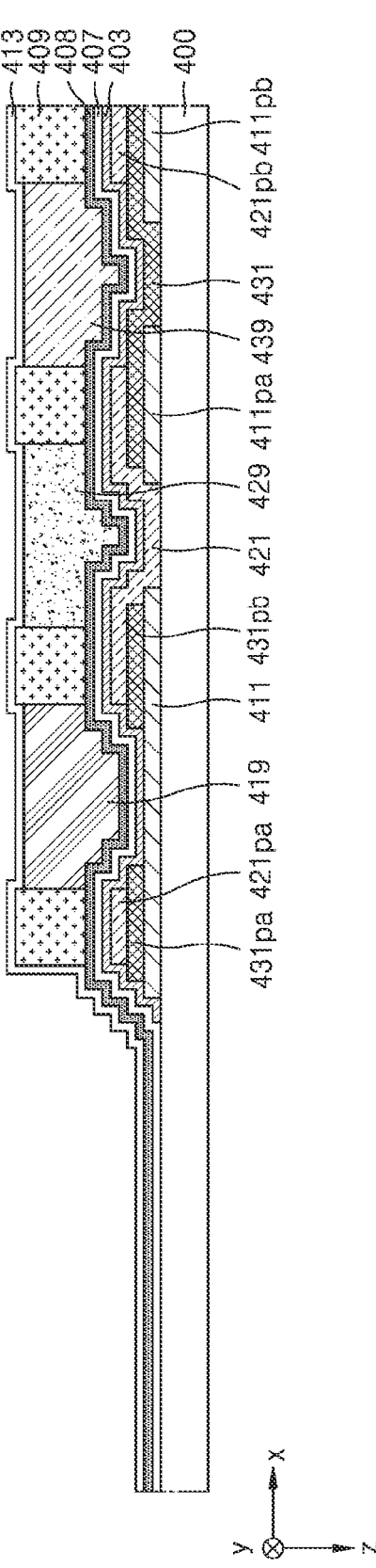
Figure 22:
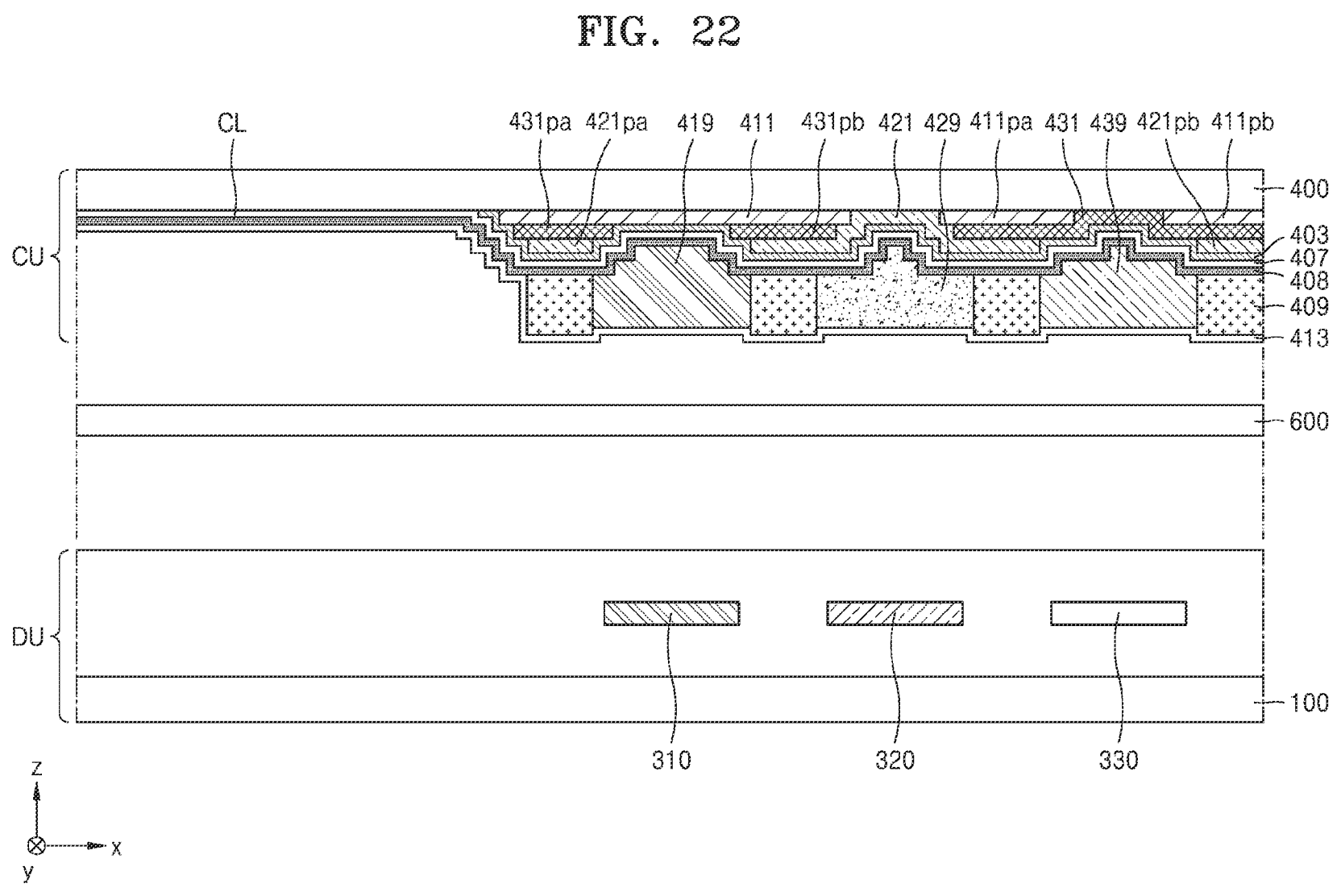

FIGS. 20 to 22 are schematic cross-sectional views showing, step by step, a method of manufacturing a display apparatus, according to an embodiment. FIGS. 20 to 22 are cross-sectional views showing, step by step, a method of manufacturing the display apparatus 1 of FIG. 10.

First, referring to FIG. 20, the first-color color filter layer 411, the first-1-color color filter pattern 411$pa$, and the first-2-color color filter pattern 411$pb$; the second-color color filter layer 421, the second-1-color color filter pattern 421$pa$, and the second-2-color color filter pattern 421$pb$; and the third-color color filter layer 431, the third-1-color color filter pattern 431$pa$, and the third-2-color color filter pattern 431$pb$ may be formed on the second substrate 400 (in the –z direction). The low-refractive-index layer 403, the first capping layer 407, and the second barrier layer 408, and the conductive line CL may be sequentially formed on and above the first-color color filter layer 411, the second-color color filter layer 421, and the third-color color filter layer 431.

The first insulating layer 409 may be formed, and a first ink composition 419$k$, a second ink composition 429$k$, and a third ink composition 439$k$ may be provided in the openings of the first insulating layer 409. The first ink composition 419$k$, the second ink composition 429$k$, and the third ink composition 439$k$ may be provided by an inkjet method using a nozzle. The first ink composition 419$k$ may include the first scattering particles 419$b$ of FIG. 3 described above, the second ink composition 429$k$ may include the first quantum dots 429$a$ and the second scattering particles 429$b$ of FIG. 3 described above, and the third ink composition 439$k$ may include the second quantum dots 439$a$ and the third scattering particles 439$b$ of FIG. 3 described above.

After the first ink composition 419$k$, the second ink composition 429$k$, and the third ink composition 439$k$ may be provided, the bias voltage Vb may be applied to the conductive line CL. The bias voltage Vb applied to the conductive line CL may be transmitted to the second barrier layer 408 electrically connected to the conductive line CL. In case that the bias voltage Vb is applied to the second barrier layer 408, a repulsive force may act between the first scattering particles 419$b$ in the first ink composition 419$k$, and thus, the first scattering particles 419$b$ may be dispersed. In case that the first scattering particles 419$b$ are not dispersed, but gathered to one side, the luminance distribution of a display apparatus may be deteriorated. As the first scattering particles 419$b$ may be dispersed by applying the bias voltage Vb to the second barrier layer 408, the luminance distribution deterioration of a display apparatus may be prevented. The description of the first ink composition 419$k$ may be identically applied to the second ink composition 429$k$ and the third ink composition 439$k$.

Referring to FIG. 21, after applying the bias voltage Vb to the conductive line CL, the first ink composition 419$k$, the second ink composition 429$k$, and the third ink composition 439$k$ may be cured so that the light output layer 419, the second-color quantum dot layer 429, and the third-color quantum dot layer 439 may be formed. The second capping layer 413 may be formed on the light output layer 419, the second-color quantum dot layer 429, and the third-color quantum dot layer 439.

Referring to FIG. 22, the color filter unit CU and the display unit DU may be bonded to each other. While a surface of the second substrate 400 may be aligned to face a surface of the first substrate 100, the first substrate 100 and the second substrate 400 may be bonded to each other. The surface of the second substrate 400 may mean a surface on which various layers constituting the color filter unit CU may be disposed, and the surface of the first substrate 100 may mean a surface on which various layers constituting the display unit DU may be disposed.

The filler 600 may be further disposed between the color filter unit CU and the display unit DU. The filler 600 may perform a buffering function with respect to external pressure and the like. The filler 600 may include an organic material, such as methyl silicone, phenyl silicone, polyimide, and/or the like. However, the disclosure is not limited thereto, and the filler 600 may include an organic sealant, such as urethane-based resin, epoxy-based resin, acrylic resin, or an inorganic sealant, such as silicon, and/or the like.

Figure 23:
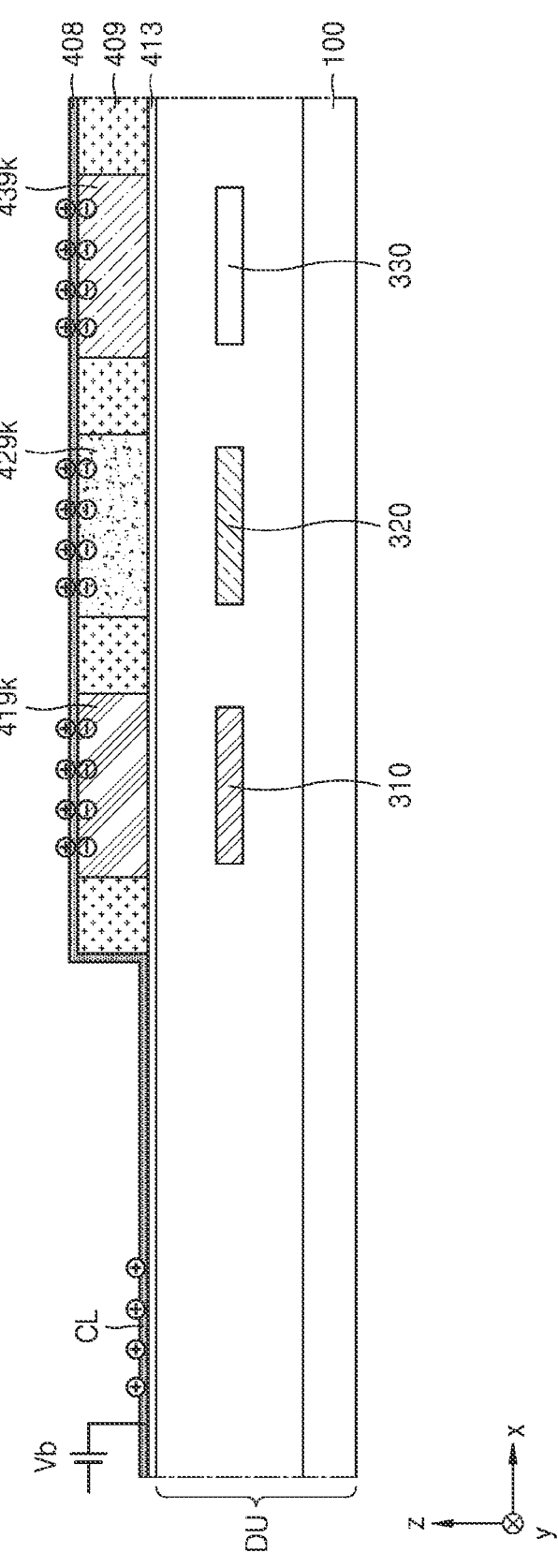
FIGS. 23 and 24 are schematic cross-sectional views showing, step by step, a method of manufacturing a display apparatus, according to an embodiment.
Figure 24:
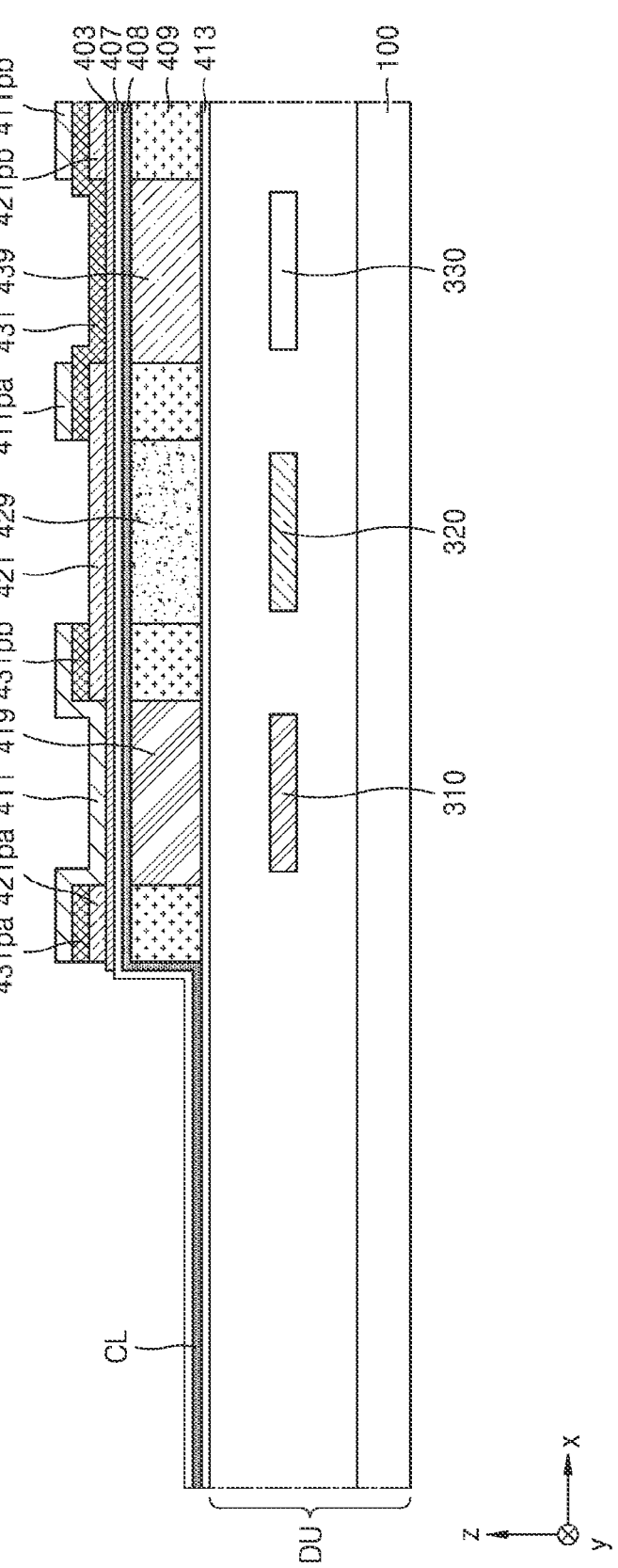

FIGS. 23 and 24 are schematic cross-sectional views showing, step by step, a method of manufacturing a display apparatus, according to an embodiment. FIGS. 23 and 24 are cross-sectional views showing, step by step, a method of manufacturing the display apparatus 1 of FIG. 12.

First, referring to FIG. 23, the second capping layer 413 may be formed on the display unit DU including the first to third light-emitting elements 310, 320, and 330. The first insulating layer 409 may be formed on the second capping layer 413, and the first ink composition 419k, the second ink composition 429k, and the third ink composition 439k may be provided in the openings of the first insulating layer 409. The first ink composition 419k, the second ink composition 429k, and the third ink composition 439k may be provided by an inkjet method using a nozzle. The first ink composition 419k may include the first scattering particles 419b of FIG. 3 described above, the second ink composition 429k may include the first quantum dots 429a and the second scattering particles 429b of FIG. 3 described above, and the third ink composition 439k may include the second quantum dots 439a and the third scattering particles 439b of FIG. 3 described above.

After the first ink composition 419k, the second ink composition 429k, and the third ink composition 439k may be provided, the conductive line CL and the second barrier layer 408 may be formed on the second capping layer 413 and the first insulating layer 409, and the bias voltage Vb may be applied to the conductive line CL. The bias voltage Vb applied to conductive line CL may be transmitted to the second barrier layer 408 electrically connected to the conductive line CL. In case that the bias voltage Vb is applied to the second barrier layer 408, a repulsive force may act between the scattering particles of each of the first ink composition 419k, the second ink composition 429k, and the third ink composition 439k, and thus, the scattering particles may be dispersed. The luminance distribution deterioration of a display apparatus may be prevented due to the dispersion of the scattering particles.

Referring to FIG. 24, after applying the bias voltage Vb to the conductive line CL, the first ink composition 419k, the second ink composition 429k, and the third ink composition 439k may be cured so that the light output layer 419, the second-color quantum dot layer 429, and the third-color quantum dot layer 439 may be formed. The first capping layer 407 and the low-refractive-index layer 403 may be sequentially formed on the light output layer 419, the second-color quantum dot layer 429, and the third-color quantum dot layer 439. The first-color color filter layer 411, the first-1-color color filter pattern 411pa, and the first-2-color color filter pattern 411pb; the second-color color filter layer 421, the second-1-color color filter pattern 421pa, and the second-2-color color filter pattern 421pb; and the third-color color filter layer 431, the third-1-color color filter pattern 431pa, and the third-2-color color filter pattern 431pb may be formed on the low-refractive-index layer 403.

Figure 25:
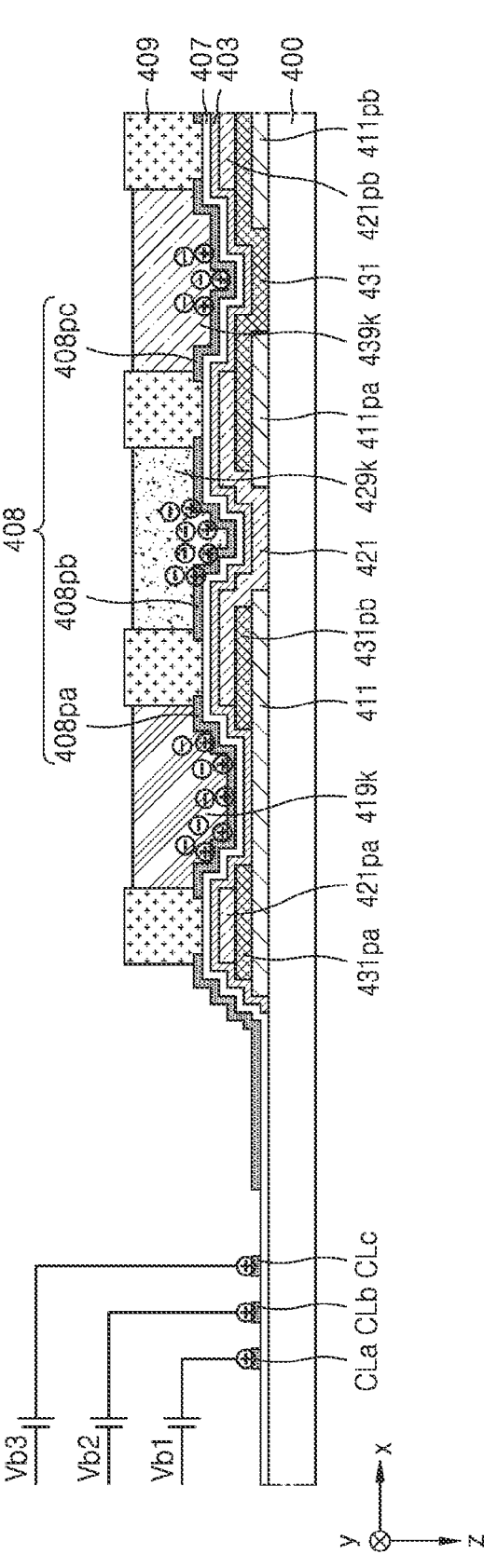
FIG. 25 is a schematic cross-sectional view showing a method of manufacturing a display apparatus, according to an embodiment.

FIG. 25 is a schematic cross-sectional view showing a method of manufacturing a display apparatus, according to an embodiment. FIG. 25 is a cross-sectional view showing a method of manufacturing the display apparatus 1 of FIG. 14.

Referring to FIG. 25, the first-color color filter layer 411, the first-1-color color filter pattern 411pa, and the first-2-color color filter pattern 411pb; the second-color color filter layer 421, the second-1-color color filter pattern 421pa, and the second-2-color color filter pattern 421pb; and the third-color color filter layer 431, the third-1-color color filter pattern 431pa, and the third-2-color color filter pattern 431pb may be formed on the second substrate 400 (in the −z direction). The low-refractive-index layer 403, the first capping layer 407, the second barrier layer 408, and the first to third conductive lines CLa, CLb, and CLc may be sequentially formed on the first-color color filter layer 411, the second-color color filter layer 421, and the third-color color filter layer 431.

As described above with reference to FIG. 14, the second barrier layer 408 may include the first barrier pattern 408pa, the second barrier pattern 408pb, and the third barrier pattern 408pc, which may be apart from one another, and the first to third conductive lines CLa, CLb, and CLc may be electrically connected to the first to third barrier patterns 408pa, 408pb, and 408pc, respectively.

After the second barrier layer 408 and the first to third conductive lines CLa, CLb, and CLc may be formed, the first insulating layer 409 may be formed, and the first ink composition 419k, the second ink composition 429k, and the third ink composition 439k may be provided into the openings of the first insulating layer 409. The first ink composition 419k, the second ink composition 429k, and the third ink composition 439k may be provided by an inkjet method using a nozzle. The first ink composition 419k may include the first scattering particles 419b of FIG. 3 described above, the second ink composition 429k may include the first quantum dots 429a and the second scattering particles 429b of FIG. 3 described above, and the third ink composition 439k may include the second quantum dots 439a and the third scattering particles 439b of FIG. 3 described above.

After the first ink composition 419k, the second ink composition 429k, and the third ink composition 439k may be provided, a first bias voltage Vb1, a second bias voltage Vb2, and a third bias voltage Vb3 may be applied to the first conductive line CLa, the second conductive line CLb, and the third conductive line CLc, respectively. The first bias voltage Vb1 applied to the first conductive line CLa may be transmitted to the first barrier pattern 408pa electrically connected to the first conductive line CLa, the second bias voltage Vb2 applied to the second conductive line CLb may be transmitted to the second barrier pattern 408pb electrically connected to the second conductive line CLb, and the third bias voltage Vb3 applied to the third conductive line CLc may be transmitted to the third barrier pattern 408pc electrically connected to the third conductive line CLc.

In an embodiment, the amount of the first bias voltage Vb1 may be based on the number density of the first scattering particles 419b, the amount of the second bias voltage Vb2 may be based on the number density of the second scattering particles 429b, and the amount of the third bias voltage Vb3 may be based on the number density of the third scattering particles 439b. For example, the number density of the first scattering particles 419b may be greater than the number density of the second scattering particles 429b and the number density of the third scattering particles 439b, and the first bias voltage Vb1 may be greater than the second bias voltage Vb2 and the third bias voltage Vb3. The number density of the second scattering particles 429*b* may be greater than the number density of the third scattering particles 439*b*, and the second bias voltage Vb2 may be greater than the third bias voltage Vb3.

As the number density of scattering particles increases, a repulsive force for dispersing the scattering particles is greater. Accordingly, by applying a bias voltage based on the number density of scattering particles, the dispersion of scattering particles may be induced more effectively. By applying the first to third bias voltages Vb1, Vb2, and Vb3 based on the number density of scattering particles to the first to third barrier patterns 408*pa*, 408*pb*, and 408*pc*, respectively, the corresponding scattering particles may be more effectively dispersed, and thus, the luminance distribution deterioration of a display apparatus may be further prevented.

According to an embodiment as described above, a display apparatus may be provided where degradation of a quantum dot layer and the deformation of a low-refractive-index layer may be prevented. The scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display apparatus comprising:
a first light-emitting element, a second light-emitting element, and a third light-emitting element, which are disposed on a substrate;
a first-color light output layer, a second-color quantum dot layer, and a third-color quantum dot layer, which are disposed on the first light-emitting element, the second light-emitting element, and the third light-emitting element, respectively;
a first capping layer disposed on the first-color light output layer, the second-color quantum dot layer, and the third-color quantum dot layer to correspond to the first light-emitting element, the second light-emitting element, and the third light-emitting element;
a low-refractive-index layer disposed on the first capping layer;
a first barrier layer between the first capping layer and the low-refractive-index layer;
a first-color color filter layer disposed on the low-refractive-index layer to correspond to the first light-emitting element;
a second-color color filter layer disposed on the low-refractive-index layer to correspond to the second light-emitting element; and
a third-color color filter layer disposed on the low-refractive-index layer to correspond to the third light-emitting element,
wherein a second barrier layer between the first capping layer and the first-color light output layer, the second-color quantum dot layer, and the third-color quantum dot layer.

2. The display apparatus of claim 1, wherein the first barrier layer and the second barrier layer comprise different materials from each other.

3. The display apparatus of claim 1, wherein the second barrier layer comprises:
a first barrier pattern corresponding to the first light-emitting element;
a second barrier pattern corresponding to the second light-emitting element; and
a third barrier pattern corresponding to the third light-emitting element, and
the first barrier pattern, the second barrier pattern, and the third barrier pattern are apart from one another.

4. The display apparatus of claim 3, wherein
each of the first light-emitting element, the second light-emitting element, and the third light-emitting element are provided in plural,
each of the first barrier pattern, the second barrier pattern, and the third barrier pattern are provided in plural, and
the display apparatus further comprises:
a first conductive line electrically connected to the plurality of first barrier patterns that correspond to the plurality of first light-emitting elements;
a second conductive line electrically connected to the plurality of second barrier patterns that correspond to the plurality of second light-emitting elements; and
a third conductive line electrically connected to the plurality of third barrier patterns that correspond to the plurality of third light-emitting elements.

5. The display apparatus of claim 1, wherein
each of the first light-emitting element, the second light-emitting element, and the third light-emitting element are provided in plural,
each of the plurality of first light-emitting elements, the plurality of second light-emitting elements, and the plurality of third light-emitting elements is arranged in a direction,
the second barrier layer comprises:
a first barrier pattern that corresponds to the plurality of first light-emitting elements;
a second barrier pattern that corresponds to the plurality of second light-emitting elements; and
a third barrier pattern that corresponds to the plurality of third light-emitting elements, and
the first barrier pattern, the second barrier pattern, and the third barrier pattern are apart from one another.

6. The display apparatus of claim 1, further comprising:
a conductive line electrically connected to the second barrier layer and extending in a direction.

7. The display apparatus of claim 1, further comprising:
a second capping layer between the first light-emitting element, the second light-emitting element, and the third light-emitting element; and the first-color light output layer, the second-color quantum dot layer, and the third-color quantum dot layer.

8. The display apparatus of claim 1, further comprising:
a third capping layer between the low-refractive-index layer and at least one of the first-color color filter layer, the second-color color filter layer, and the third-color color filter layer.

9. The display apparatus of claim 1, wherein the first barrier layer comprises a transparent organic layer.

10. The display apparatus of claim 1, wherein the low-refractive-index layer comprises a matrix portion and particles in the matrix portion.

11. A display apparatus comprising:
a first light-emitting element, a second light-emitting element, and a third light-emitting element, which are disposed on a substrate;

a first-color light output layer, a second-color quantum dot layer, and a third-color quantum dot layer, which are disposed on the first light-emitting element, the second light-emitting element, and the third light-emitting element, respectively;

a first capping layer disposed on the first-color light output layer, the second-color quantum dot layer, and the third-color quantum dot layer to correspond to the first light-emitting element, the second light-emitting element, and the third light-emitting element;

a low-refractive-index layer disposed on the first capping layer;

a barrier layer between the first capping layer and the first-color light output layer, the second-color quantum dot layer, and the third-color quantum dot layer;

a first-color color filter layer disposed on the low-refractive-index layer to correspond to the first light-emitting element;

a second-color color filter layer disposed on the low-refractive-index layer to correspond to the second light-emitting element; and a third-color color filter layer disposed on the low-refractive-index layer to correspond to the third light-emitting element, wherein a conductive line electrically connected to the barrier layer and extending in a direction.

12. The display apparatus of claim 11, wherein the barrier layer comprises a transparent conductive material.

13. The display apparatus of claim 11, wherein the barrier layer comprises:

a first barrier pattern corresponding to the first light-emitting element;

a second barrier pattern corresponding to the second light-emitting element; and a third barrier pattern corresponding to the third light-emitting element, and the first barrier pattern, the second barrier pattern, and the third barrier pattern are apart from one another.

14. The display apparatus of claim 13, wherein each of the first light-emitting element, the second light-emitting element, and the third light-emitting element are provided in plural, each of the first barrier pattern, the second barrier pattern, and the third barrier pattern are provided in plural, and the display apparatus further comprises:

a first conductive line electrically connected to the plurality of first barrier patterns that correspond to the plurality of first light-emitting elements;

a second conductive line electrically connected to the plurality of second barrier patterns that correspond to the plurality of second light-emitting elements; and a third conductive line electrically connected to the plurality of third barrier patterns that correspond to the plurality of third light-emitting elements.

15. The display apparatus of claim 11, wherein each of the first light-emitting element, the second light-emitting element, and the third light-emitting element are provided in plural, each of the plurality of first light-emitting elements, the plurality of second light-emitting elements, and the plurality of third light-emitting elements is arranged in a direction, the barrier layer comprises:

a first barrier pattern that corresponds to the plurality of first light-emitting elements;

a second barrier pattern that corresponds to the plurality of second light-emitting elements; and a third barrier pattern that corresponds to the plurality of third light-emitting elements, and the first barrier pattern, the second barrier pattern, and the third barrier pattern are apart from one another.

16. The display apparatus of claim 11, further comprising:

a second capping layer between the first light-emitting element, the second light-emitting element, and the third light-emitting element; and the first-color light output layer, the second-color quantum dot layer, and the third-color quantum dot layer.

17. The display apparatus of claim 11, further comprising:

a third capping layer between the low-refractive-index layer and at least one of the first-color color filter layer, the second-color color filter layer, and the third-color color filter layer.

18. The display apparatus of claim 11, wherein the low-refractive-index layer comprises a matrix portion and particles in the matrix portion.

* * * * *